United States Patent
Penney et al.

(10) Patent No.: US 11,984,148 B2
(45) Date of Patent: *May 14, 2024

(54) APPARATUSES AND METHODS FOR TRACKING VICTIM ROWS

(71) Applicant: Micron Technology, Inc., Boise, ID (US)

(72) Inventors: Daniel B. Penney, Boise, ID (US); Jason M. Brown, Boise, ID (US); Nathaniel J. Meier, Boise, ID (US); Timothy B. Cowles, Boise, ID (US); Jiyun Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 124 days.

This patent is subject to a terminal disclaimer.

(21) Appl. No.: 17/470,883

(22) Filed: Sep. 9, 2021

(65) Prior Publication Data

US 2021/0407583 A1    Dec. 30, 2021

Related U.S. Application Data

(63) Continuation of application No. 16/428,625, filed on May 31, 2019, now Pat. No. 11,158,364.

(51) Int. Cl.
*G11C 11/406* (2006.01)
*G11C 11/408* (2006.01)

(52) U.S. Cl.
CPC ..... *G11C 11/40611* (2013.01); *G11C 11/4085* (2013.01); *G11C 11/4087* (2013.01)

(58) Field of Classification Search
CPC .......... G11C 11/40611; G11C 11/4085; G11C 11/4087
See application file for complete search history.

(56) References Cited

U.S. PATENT DOCUMENTS

| | | | |
|---|---|---|---|
| 3,633,175 | A | 1/1972 | Harper |
| 4,679,173 | A | 7/1987 | Sato |

(Continued)

FOREIGN PATENT DOCUMENTS

| | | | |
|---|---|---|---|
| CN | 1144434 A | 3/1997 | |
| CN | 1195173 A | 10/1998 | |

(Continued)

OTHER PUBLICATIONS

US 11,264,075 B2, 03/2022, Bell et al. (withdrawn)

(Continued)

*Primary Examiner* — Mushfique Siddique
(74) *Attorney, Agent, or Firm* — Dorsey & Whitney LLP

(57) ABSTRACT

The address of victim rows may be determined based on rows that are accessed in a memory. The victim addresses may be stored and associated with a count for every time a victim row is "victimized." When the count for a victim row reaches a threshold, the victim row may be refreshed to preserve data stored in the row. After the victim row has been refreshed, the count may be reset. When a victim row is accessed, the count may also be reset. The counts may be adjusted for closer victim rows (e.g., +/−1) at a faster rate than counts for more distant victim rows (e.g., +/−2). This may cause closer victim rows to be refreshed at a higher rate than more distant victim rows.

17 Claims, 6 Drawing Sheets

(56) References Cited

U.S. PATENT DOCUMENTS

| | | |
|---|---|---|
| 5,089,957 A | 2/1992 | Stultz et al. |
| 5,291,198 A | 3/1994 | Dingwall et al. |
| 5,299,159 A | 3/1994 | Balistreri et al. |
| 5,422,850 A | 6/1995 | Sukegawa et al. |
| 5,638,317 A | 6/1997 | Tran |
| 5,699,297 A | 12/1997 | Yamazaki et al. |
| 5,751,655 A | 5/1998 | Yamazaki et al. |
| 5,768,196 A | 6/1998 | Bloker et al. |
| 5,874,907 A | 2/1999 | Craft |
| 5,933,377 A | 8/1999 | Hidaka |
| 5,943,283 A | 8/1999 | Wong et al. |
| 5,970,507 A | 10/1999 | Kato et al. |
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |
| 6,212,118 B1 | 4/2001 | Fujita |
| 6,310,806 B1 | 10/2001 | Higashi et al. |
| 6,317,381 B1 | 11/2001 | Gans et al. |
| 6,373,738 B1 | 4/2002 | Towler et al. |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,480,931 B1 | 11/2002 | Buti et al. |
| 6,515,928 B2 | 2/2003 | Sato et al. |
| 6,567,340 B1 | 5/2003 | Nataraj et al. |
| 6,950,364 B2 | 9/2005 | Kim |
| 7,027,343 B2 | 4/2006 | Sinha et al. |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,283,380 B1 | 10/2007 | Srinivasan et al. |
| 7,304,875 B1 | 12/2007 | Lien et al. |
| 7,319,602 B1 | 1/2008 | Srinivasan et al. |
| 7,444,577 B2 | 10/2008 | Best et al. |
| 7,551,502 B2 | 6/2009 | Dono et al. |
| 7,565,479 B2 | 7/2009 | Best et al. |
| 7,830,742 B2 | 11/2010 | Han |
| 7,870,362 B2 | 1/2011 | Hong et al. |
| 7,872,907 B2 | 1/2011 | Okayama et al. |
| 8,174,921 B2 | 5/2012 | Kim et al. |
| 8,400,805 B2 | 3/2013 | Yoko |
| 8,451,677 B2 | 5/2013 | Okahiro et al. |
| 8,625,360 B2 | 1/2014 | Iwamoto et al. |
| 8,676,725 B1 | 3/2014 | Lin et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,058,900 B2 | 6/2015 | Kang |
| 9,087,554 B1 | 7/2015 | Park |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,251,885 B2 | 2/2016 | Greenfield et al. |
| 9,286,964 B2 | 3/2016 | Halbert et al. |
| 9,299,457 B2 | 3/2016 | Chun et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,412,432 B2 | 8/2016 | Narui et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,646,672 B1 | 5/2017 | Kim et al. |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,818,469 B1 | 11/2017 | Kim et al. |
| 9,847,118 B1 | 12/2017 | Won |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 10,032,501 B2 | 7/2018 | Ito et al. |
| 10,083,737 B2 | 9/2018 | Bains et al. |
| 10,090,038 B2 | 10/2018 | Shin |
| 10,134,461 B2 | 11/2018 | Bell et al. |
| 10,147,472 B2 | 12/2018 | Jones et al. |
| 10,153,031 B2 | 12/2018 | Akamatsu |
| 10,170,174 B1 | 1/2019 | Ito et al. |
| 10,176,860 B1 | 1/2019 | Mylavarapu |
| 10,210,925 B2 | 2/2019 | Bains et al. |
| 10,297,305 B1 | 5/2019 | Moon et al. |
| 10,339,994 B2 | 7/2019 | Ito et al. |
| 10,381,327 B2 | 8/2019 | Ramachandra et al. |
| 10,387,276 B2 | 8/2019 | Ryu et al. |
| 10,446,216 B2 | 10/2019 | Oh et al. |
| 10,490,251 B2 | 11/2019 | Wolff |
| 10,600,462 B2 | 3/2020 | Augustine et al. |
| 10,600,491 B2 | 3/2020 | Chou et al. |
| 10,607,686 B2 | 3/2020 | Akamatsu |
| 10,629,286 B2 | 4/2020 | Lee et al. |
| 10,679,710 B2 | 6/2020 | Hirashima et al. |
| 10,705,900 B2 | 7/2020 | Jin |
| 10,770,127 B2 | 9/2020 | Shore et al. |
| 10,811,066 B2 | 10/2020 | Jones et al. |
| 10,832,792 B1 | 11/2020 | Penney et al. |
| 10,861,519 B2 | 12/2020 | Jones et al. |
| 10,867,660 B2 | 12/2020 | Akamatsu |
| 10,930,335 B2 | 2/2021 | Bell et al. |
| 10,943,636 B1 | 3/2021 | Wu et al. |
| 10,950,289 B2 | 3/2021 | Ito et al. |
| 10,964,378 B2 | 3/2021 | Ayyapureddi et al. |
| 11,011,215 B1 | 5/2021 | Parry et al. |
| 11,043,254 B2 | 6/2021 | Enomoto et al. |
| 11,139,015 B2 | 10/2021 | Brown et al. |
| 11,152,050 B2 | 10/2021 | Morohashi et al. |
| 11,158,364 B2 | 10/2021 | Penney et al. |
| 11,158,373 B2 | 10/2021 | Penney et al. |
| 11,200,942 B2 | 12/2021 | Jenkinson et al. |
| 11,222,682 B1 | 1/2022 | Enomoto et al. |
| 11,257,535 B2 | 2/2022 | Shore et al. |
| 11,264,096 B2 | 3/2022 | Schreck et al. |
| 11,322,192 B2 | 5/2022 | Morohashi et al. |
| 11,361,808 B2 | 6/2022 | Bell et al. |
| 11,386,946 B2 | 7/2022 | Ayyapureddi et al. |
| 11,398,265 B2 | 7/2022 | Wu et al. |
| 11,424,005 B2 | 8/2022 | Penney et al. |
| 11,462,291 B2 | 10/2022 | Pan |
| 11,482,275 B2 | 10/2022 | Ayyapureddi et al. |
| 11,521,669 B2 | 12/2022 | Enomoto et al. |
| 11,568,918 B2 | 1/2023 | Ayyapureddi et al. |
| 11,600,314 B2 | 3/2023 | Ayyapureddi et al. |
| 11,600,326 B2 | 3/2023 | Schreck et al. |
| 11,664,063 B2 | 5/2023 | Lovett |
| 11,688,451 B2 | 6/2023 | Zhang et al. |
| 11,694,738 B2 | 7/2023 | Morohashi et al. |
| 11,699,476 B2 | 7/2023 | Brown et al. |
| 2001/0008498 A1 | 7/2001 | Ooishi |

(56) References Cited

U.S. PATENT DOCUMENTS

| | | |
|---|---|---|
| 2002/0007476 A1 | 1/2002 | Kishino |
| 2002/0078311 A1 | 6/2002 | Matsuzaki et al. |
| 2002/0080677 A1 | 6/2002 | Watanabe et al. |
| 2002/0181301 A1 | 12/2002 | Takahashi et al. |
| 2003/0063512 A1 | 4/2003 | Takahashi et al. |
| 2003/0067825 A1 | 4/2003 | Shimano et al. |
| 2003/0090400 A1 | 5/2003 | Barker |
| 2003/0123301 A1 | 7/2003 | Jang et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0052142 A1 | 3/2004 | Ikehashi et al. |
| 2004/0114446 A1 | 6/2004 | Takahashi et al. |
| 2004/0130959 A1 | 7/2004 | Kawaguchi |
| 2004/0174757 A1 | 9/2004 | Garverick et al. |
| 2004/0184323 A1 | 9/2004 | Mori et al. |
| 2004/0213035 A1 | 10/2004 | Cavaleri et al. |
| 2004/0218431 A1 | 11/2004 | Chung et al. |
| 2005/0041502 A1 | 2/2005 | Perner |
| 2005/0105315 A1 | 5/2005 | Shin et al. |
| 2005/0243629 A1 | 11/2005 | Lee |
| 2005/0265104 A1 | 12/2005 | Remaklus et al. |
| 2006/0039229 A1 | 2/2006 | Nakano |
| 2006/0059196 A1 | 3/2006 | Sato et al. |
| 2006/0083099 A1 | 4/2006 | Bae et al. |
| 2006/0087903 A1 | 4/2006 | Riho et al. |
| 2006/0119406 A1 | 6/2006 | Henzler et al. |
| 2006/0176744 A1 | 8/2006 | Stave |
| 2006/0262616 A1 | 11/2006 | Chen |
| 2007/0008799 A1 | 1/2007 | Dono et al. |
| 2007/0014174 A1 | 1/2007 | Ohsawa |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0133330 A1 | 6/2007 | Ohsawa |
| 2007/0153611 A1 | 7/2007 | Lee |
| 2007/0230264 A1 | 10/2007 | Eto |
| 2007/0237016 A1 | 10/2007 | Miyamoto et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0062742 A1 | 3/2008 | Wang |
| 2008/0126893 A1 | 5/2008 | Harrand et al. |
| 2008/0130394 A1 | 6/2008 | Dono et al. |
| 2008/0181048 A1 | 7/2008 | Han |
| 2008/0224742 A1 | 9/2008 | Pomichter |
| 2008/0253212 A1 | 10/2008 | Iida et al. |
| 2008/0266990 A1 | 10/2008 | Loeffler |
| 2008/0288720 A1 | 11/2008 | Atwal et al. |
| 2008/0301362 A1 | 12/2008 | Cavanna et al. |
| 2008/0313494 A1 | 12/2008 | Hummler et al. |
| 2008/0316845 A1 | 12/2008 | Wang et al. |
| 2009/0021999 A1 | 1/2009 | Tanimura et al. |
| 2009/0059641 A1 | 3/2009 | Jeddeloh |
| 2009/0077571 A1 | 3/2009 | Gara et al. |
| 2009/0161457 A1 | 6/2009 | Wakimoto |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0213675 A1 | 8/2009 | Shino |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0054011 A1 | 3/2010 | Kim |
| 2010/0074042 A1 | 3/2010 | Fukuda et al. |
| 2010/0080074 A1 | 4/2010 | Ohmaru et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0157693 A1 | 6/2010 | Iwai et al. |
| 2010/0182863 A1 | 7/2010 | Fukiage |
| 2010/0260003 A1 | 10/2010 | Oh |
| 2010/0329069 A1 | 12/2010 | Ito et al. |
| 2011/0026290 A1 | 2/2011 | Noda et al. |
| 2011/0051530 A1 | 3/2011 | Kushida |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0216614 A1 | 9/2011 | Hosoe |
| 2011/0225355 A1 | 9/2011 | Kajigaya |
| 2011/0286271 A1 | 11/2011 | Chen |
| 2011/0310648 A1 | 12/2011 | Iwamoto et al. |
| 2011/0317462 A1 | 12/2011 | Gyllenhammer et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0213021 A1 | 8/2012 | Riho et al. |
| 2012/0254472 A1 | 10/2012 | Ware et al. |
| 2013/0003467 A1 | 1/2013 | Klein |
| 2013/0003477 A1 | 1/2013 | Park et al. |
| 2013/0057173 A1 | 3/2013 | Yao et al. |
| 2013/0107623 A1 | 5/2013 | Kavalipurapu et al. |
| 2013/0173971 A1 | 7/2013 | Zimmerman |
| 2013/0254475 A1 | 9/2013 | Perego et al. |
| 2013/0279284 A1 | 10/2013 | Jeong |
| 2013/0304982 A1 | 11/2013 | Jung et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0078845 A1 | 3/2014 | Song |
| 2014/0089576 A1 | 3/2014 | Bains et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0136763 A1 | 5/2014 | Li et al. |
| 2014/0143473 A1 | 5/2014 | Kim et al. |
| 2014/0177370 A1 | 6/2014 | Halbert et al. |
| 2014/0177376 A1 | 6/2014 | Song |
| 2014/0189215 A1 | 7/2014 | Kang et al. |
| 2014/0189228 A1 | 7/2014 | Greenfield et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0269021 A1 | 9/2014 | Yang et al. |
| 2014/0281206 A1 | 9/2014 | Crawford et al. |
| 2014/0281207 A1 | 9/2014 | Mandava et al. |
| 2014/0292375 A1 | 10/2014 | Angelini et al. |
| 2014/0293725 A1 | 10/2014 | Best et al. |
| 2014/0317344 A1 | 10/2014 | Kim |
| 2014/0355332 A1 | 12/2014 | Youn et al. |
| 2014/0369109 A1 | 12/2014 | Lee et al. |
| 2014/0379978 A1 | 12/2014 | Kim et al. |
| 2015/0049567 A1 | 2/2015 | Chi |
| 2015/0055420 A1 | 2/2015 | Bell et al. |
| 2015/0078112 A1 | 3/2015 | Huang |
| 2015/0089326 A1 | 3/2015 | Joo et al. |
| 2015/0155027 A1 | 6/2015 | Abe et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0213877 A1 | 7/2015 | Darel |
| 2015/0228341 A1 | 8/2015 | Watanabe et al. |
| 2015/0243339 A1 | 8/2015 | Bell et al. |
| 2015/0255140 A1 | 9/2015 | Song |
| 2015/0262652 A1 | 9/2015 | Igarashi |
| 2015/0279441 A1 | 10/2015 | Greenberg et al. |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |

(56) References Cited

U.S. PATENT DOCUMENTS

| | | |
|---|---|---|
| 2016/0042782 A1 | 2/2016 | Narui et al. |
| 2016/0078845 A1 | 3/2016 | Lin et al. |
| 2016/0078911 A1 | 3/2016 | Fujiwara et al. |
| 2016/0078918 A1 | 3/2016 | Hyun et al. |
| 2016/0086649 A1 | 3/2016 | Hong et al. |
| 2016/0086651 A1 | 3/2016 | Kim |
| 2016/0093402 A1 | 3/2016 | Kitagawa et al. |
| 2016/0099043 A1 | 4/2016 | Tu |
| 2016/0111140 A1 | 4/2016 | Joo et al. |
| 2016/0125931 A1 | 5/2016 | Doo et al. |
| 2016/0133314 A1 | 5/2016 | Hwang et al. |
| 2016/0140243 A1 | 5/2016 | Adams et al. |
| 2016/0163372 A1 | 6/2016 | Lee et al. |
| 2016/0172056 A1 | 6/2016 | Huh |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1* | 7/2016 | Benedict ............... G06F 12/123 711/106 |
| 2016/0211008 A1 | 7/2016 | Benedict et al. |
| 2016/0224262 A1 | 8/2016 | Mandava et al. |
| 2016/0225433 A1 | 8/2016 | Bains et al. |
| 2016/0225461 A1 | 8/2016 | Tuers et al. |
| 2016/0336060 A1 | 11/2016 | Shin |
| 2016/0343423 A1 | 11/2016 | Shido |
| 2017/0011792 A1 | 1/2017 | Oh et al. |
| 2017/0076779 A1 | 3/2017 | Bains et al. |
| 2017/0092350 A1 | 3/2017 | Halbert et al. |
| 2017/0117030 A1 | 4/2017 | Fisch et al. |
| 2017/0133085 A1 | 5/2017 | Kim et al. |
| 2017/0139641 A1 | 5/2017 | Cha et al. |
| 2017/0140807 A1 | 5/2017 | Sun et al. |
| 2017/0140811 A1 | 5/2017 | Joo |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0287547 A1* | 10/2017 | Ito ........................ G11C 29/783 |
| 2017/0323675 A1 | 11/2017 | Jones et al. |
| 2017/0352399 A1 | 12/2017 | Yokoyama et al. |
| 2017/0371742 A1 | 12/2017 | Shim et al. |
| 2017/0372767 A1 | 12/2017 | Kang et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0060194 A1 | 3/2018 | Ryu et al. |
| 2018/0061483 A1 | 3/2018 | Morgan |
| 2018/0082737 A1 | 3/2018 | Lee |
| 2018/0084314 A1 | 3/2018 | Koyama |
| 2018/0090199 A1 | 3/2018 | Kim et al. |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0114561 A1 | 4/2018 | Fisch et al. |
| 2018/0114565 A1 | 4/2018 | Lee |
| 2018/0158504 A1 | 6/2018 | Akamatsu |
| 2018/0158507 A1 | 6/2018 | Bang |
| 2018/0182445 A1 | 6/2018 | Lee et al. |
| 2018/0203621 A1 | 7/2018 | Ahn et al. |
| 2018/0218767 A1* | 8/2018 | Wolff ..................... G11C 11/408 |
| 2018/0261268 A1 | 9/2018 | Hyun et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2018/0342282 A1* | 11/2018 | Morgan .............. G11C 11/4078 |
| 2018/0366182 A1 | 12/2018 | Hyun et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0066759 A1 | 2/2019 | Nale |
| 2019/0066762 A1 | 2/2019 | Koya |
| 2019/0088315 A1 | 3/2019 | Saenz et al. |
| 2019/0088316 A1 | 3/2019 | Inuzuka et al. |
| 2019/0096492 A1 | 3/2019 | Cai et al. |
| 2019/0103147 A1 | 4/2019 | Jones et al. |
| 2019/0130961 A1 | 5/2019 | Bell et al. |
| 2019/0139599 A1 | 5/2019 | Ito et al. |
| 2019/0147941 A1 | 5/2019 | Qin et al. |
| 2019/0147964 A1 | 5/2019 | Yun et al. |
| 2019/0161341 A1 | 5/2019 | Howe |
| 2019/0172518 A1 | 6/2019 | Chen et al. |
| 2019/0187745 A1 | 6/2019 | Murali et al. |
| 2019/0196730 A1 | 6/2019 | Imran |
| 2019/0198078 A1 | 6/2019 | Hoang et al. |
| 2019/0198090 A1 | 6/2019 | Lee |
| 2019/0198099 A1 | 6/2019 | Mirichigni et al. |
| 2019/0205253 A1 | 7/2019 | Roberts |
| 2019/0207736 A1 | 7/2019 | Ben-tovim et al. |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237132 A1 | 8/2019 | Morohashi |
| 2019/0243708 A1 | 8/2019 | Cha et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0333573 A1 | 10/2019 | Shin et al. |
| 2019/0347019 A1* | 11/2019 | Shin ...................... G06F 3/0629 |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0348107 A1 | 11/2019 | Shin et al. |
| 2019/0349545 A1 | 11/2019 | Koh et al. |
| 2019/0362774 A1 | 11/2019 | Kuramori et al. |
| 2019/0371391 A1 | 12/2019 | Cha et al. |
| 2019/0385661 A1 | 12/2019 | Koo et al. |
| 2019/0385667 A1 | 12/2019 | Morohashi et al. |
| 2019/0386557 A1 | 12/2019 | Wang et al. |
| 2020/0005857 A1 | 1/2020 | Ito et al. |
| 2020/0075106 A1 | 3/2020 | Tokutomi et al. |
| 2020/0082873 A1 | 3/2020 | Wolff |
| 2020/0090760 A1 | 3/2020 | Purahmad et al. |
| 2020/0135263 A1 | 4/2020 | Brown et al. |
| 2020/0194050 A1 | 6/2020 | Akamatsu |
| 2020/0194056 A1 | 6/2020 | Sakurai et al. |
| 2020/0201380 A1 | 6/2020 | Murali et al. |
| 2020/0202921 A1 | 6/2020 | Morohashi et al. |
| 2020/0211626 A1 | 7/2020 | Hiscock et al. |
| 2020/0211633 A1* | 7/2020 | Okuma ............... G06F 12/0646 |
| 2020/0211636 A1 | 7/2020 | Hiscock et al. |
| 2020/0251158 A1 | 8/2020 | Shore et al. |
| 2020/0294576 A1 | 9/2020 | Brown et al. |
| 2020/0302994 A1 | 9/2020 | Enomoto et al. |
| 2020/0321049 A1 | 10/2020 | Meier et al. |
| 2020/0349995 A1 | 11/2020 | Shore et al. |
| 2020/0365208 A1 | 11/2020 | Schreck et al. |
| 2020/0381040 A1 | 12/2020 | Penney et al. |
| 2020/0395072 A1 | 12/2020 | Penney et al. |
| 2020/0411095 A1 | 12/2020 | Kim |
| 2021/0005229 A1 | 1/2021 | Hiscock et al. |
| 2021/0005240 A1 | 1/2021 | Brown et al. |
| 2021/0020223 A1 | 1/2021 | Ayyapureddi et al. |
| 2021/0020262 A1 | 1/2021 | Penney et al. |
| 2021/0026732 A1 | 1/2021 | Park et al. |
| 2021/0057012 A1 | 2/2021 | Ayyapureddi et al. |
| 2021/0057013 A1 | 2/2021 | Jenkinson et al. |
| 2021/0057021 A1 | 2/2021 | Wu et al. |
| 2021/0065755 A1 | 3/2021 | Kim et al. |
| 2021/0065764 A1 | 3/2021 | Cheng et al. |
| 2021/0142852 A1 | 5/2021 | Schreck et al. |
| 2021/0158851 A1 | 5/2021 | Ayyapureddi et al. |
| 2021/0158860 A1 | 5/2021 | Wu et al. |
| 2021/0158861 A1 | 5/2021 | Jeong et al. |
| 2021/0201984 A1 | 7/2021 | Khasawneh et al. |
| 2021/0225432 A1 | 7/2021 | Enomoto et al. |
| 2021/0241810 A1 | 8/2021 | Hollis et al. |
| 2021/0265504 A1 | 8/2021 | Ishizu et al. |
| 2021/0343324 A1 | 11/2021 | Brown et al. |
| 2021/0350844 A1 | 11/2021 | Morohashi et al. |
| 2021/0398592 A1 | 12/2021 | Penney et al. |
| 2022/0068348 A1 | 3/2022 | Bennett et al. |
| 2022/0069992 A1 | 3/2022 | Ayyapureddi |

(56) References Cited

U.S. PATENT DOCUMENTS

| | | | |
|---|---|---|---|
| 2022/0165347 A1 | 5/2022 | Pan | |
| 2022/0230672 A1 | 7/2022 | Ayyapureddi et al. | |
| 2022/0293166 A1 | 9/2022 | Ayyapureddi et al. | |
| 2022/0415427 A1 | 12/2022 | Pan | |
| 2023/0010619 A1 | 1/2023 | Ayyapureddi et al. | |
| 2023/0047007 A1 | 2/2023 | Lovett | |
| 2023/0170008 A1 | 6/2023 | Zhang et al. | |
| 2023/0205428 A1 | 6/2023 | Kim et al. | |
| 2023/0206980 A1 | 6/2023 | He et al. | |
| 2023/0206989 A1 | 6/2023 | He et al. | |

FOREIGN PATENT DOCUMENTS

| | | |
|---|---|---|
| CN | 1371100 A | 9/2002 |
| CN | 101038785 A | 9/2007 |
| CN | 101067972 A | 11/2007 |
| CN | 101331554 A | 12/2008 |
| CN | 101346775 A | 1/2009 |
| CN | 101458658 A | 6/2009 |
| CN | 101622607 A | 1/2010 |
| CN | 102074268 A | 5/2011 |
| CN | 102113058 A | 6/2011 |
| CN | 102364991 A | 2/2012 |
| CN | 102483952 A | 5/2012 |
| CN | 103366808 A | 10/2013 |
| CN | 103544987 A | 1/2014 |
| CN | 103928048 A | 7/2014 |
| CN | 104350546 A | 2/2015 |
| CN | 106710621 A | 5/2017 |
| CN | 107256717 A | 10/2017 |
| CN | 107871516 A | 4/2018 |
| CN | 108122581 A | 6/2018 |
| CN | 108154895 A | 6/2018 |
| CN | 109074305 B | 7/2023 |
| JP | H0773682 A | 3/1995 |
| JP | H10241385 A | 9/1998 |
| JP | 2005-216429 A | 8/2005 |
| JP | 2011-258259 A | 12/2011 |
| JP | 4911510 B2 | 1/2012 |
| JP | 2013-004158 A | 1/2013 |
| KR | 20150002112 A | 1/2015 |
| KR | 20150002783 A | 1/2015 |
| KR | 20170058022 A | 5/2017 |
| KR | 1020180064940 A | 6/2018 |
| KR | 1020180085184 A | 7/2018 |
| KR | 20190048049 A | 5/2019 |
| WO | 2014120477 | 8/2014 |
| WO | 2015030991 A1 | 3/2015 |
| WO | 2017171927 A1 | 10/2017 |
| WO | 2019222960 A1 | 11/2019 |
| WO | 2020010010 A1 | 1/2020 |
| WO | 2020191222 A1 | 9/2020 |
| WO | 2021003085 A1 | 1/2021 |
| WO | 2022108808 A1 | 5/2022 |

OTHER PUBLICATIONS

U.S. Appl. No. 17/456,849 titled "Apparatuses, Systems, and Methods for Main Sketch and Slim Sketch Circuitfor Row Address Tracking" filed Nov. 29, 2021, pp. all pages of application as filed.
U.S. Appl. No. 17/565,119 titled "Apparatuses and Methods for Row Hammer Counter Mat" filed Dec. 29, 2021, pp. all pages of application as filed.
U.S. Appl. No. 17/565,187 titled "Apparatuses and Methods for Row Hammer Counter Mat" filed Dec. 29, 2021, pp. all pages of application as filed.
U.S. Appl. No. 17/932,206, titled, "Apparatuses and Methods for Dynamically Allocated Aggressor Detection" filed Sep. 14, 2022; pp. all pages of application as filed.
U.S. Appl. No. 17/822,033, titled, "Apparatuses and Methods for Tracking Word Line Accesses" filed Aug. 24, 2022, pp. all pages of application as filed.

International Application No. PCT/US20/23689, titled "Semiconductor Device Having Cam That Stores Address Signals", dated Mar. 19, 2020, pp. all.
U.S. Appl. No. 15/884,192 entitled 'Semiconductor Device Performing Row Hammer Refresh Operation' filed Jan. 30, 2018, pp. all.
U.S. Appl. No. 16/797,658, titles "Apparatuses and Methods for Controlling Refresh Operations", filed Feb. 21, 2020, pp. all.
U.S. Appl. No. 16/818,981 titled "Apparatuses and Methods for Staggered Timing of Targeted Refresh Operations" filed Mar. 13, 2020, pp. all.
U.S. Appl. No. 16/824,460, titled "Semiconductor Device Performing Row Hammer Refresh Operation", dated Mar. 19, 2020, pp. all.
U.S. Appl. No. 16/025,844, titled "Apparatus and Methods for Triggering Row Hammer Address Sampling", filed Jul. 2, 2018, pp. all.
U.S. Appl. No. 16/783,063, titled "Apparatus and Methods for Triggering Row Hammer Address Sampling", dated Feb. 5, 2020, pp. all.
U.S. Appl. No. 16/805,197, titled "Apparatuses and Methods for Calculating Row Hammer Refresh Addresses in a Semiconductor Device", dated Feb. 28, 2020, pp. all.
U.S. Appl. No. 16/232,837, titled "Apparatuses and Methods for Distributed Targeted Refresh Operations", filed Dec. 26, 2018, pp. all.
U.S. Appl. No. 16/818,989, titled "Semiconductor Device Performing Row Hammer Refresh Operation", dated Mar. 13, 2020, pp. all.
U.S. Appl. No. 16/268,818, titled "Apparatuses and Methods for Managing Row Access Counts", filed Feb. 6, 2019, pp. all.
U.S. Appl. No. 16/286,187 titled "Apparatuses and Methods for Memory Mat Refresh Sequencing" filed Feb. 26, 2019, pp. all.
U.S. Appl. No. 16/084,119, titled "Apparatuses and Methods for Pure-Time, Self Adopt Sampling for Row Hammer Refresh Sampling", filed Sep. 11, 2018, pp. all.
U.S. Appl. No. 16/886,284 titled "Apparatuses and Methods for Access Based Refresh Timing" filed May 28, 2020, pp. all.
U.S. Appl. No. 16/886,284 titled "Apparatuses and Methods for Access Based Refresh Timing", dated May 28, 2020, pp. all.
U.S. Appl. No. 16/358,587, titled "Semiconductor Device Having Cam That Stores Address Signals", dated Mar. 19, 2019, pp. all.
U.S. Appl. No. 16/375,716 titled "Apparatuses and Methods for Staggered Timing of Targeted Refresh Operations" filed Apr. 4, 2019; pp. all.
U.S. Appl. No. 16/936,297 titled "Apparatuses and Methods for Managing Row Access Counts" filed Jul. 22, 2020, pp. all.
U.S. Appl. No. 16/411,573 titled "Apparatuses, Systems, and Methods for a Content Addressable Memory Cell" filed May 14, 2019, pp. all.
U.S. Appl. No. 16/428,625 titled "Apparatuses and Methods for Tracking Victim Rows" filed May 31, 2019, pp. all.
U.S. Appl. No. 16/513,400 titled "Apparatuses and Methods for Tracking Row Accesses" filed Jul. 16, 2019, pp. all.
U.S. Appl. No. 17/060,403 titled "Apparatuses and Methods for Adjusting Victim Data" filed Oct. 1, 2020, pp. all.
U.S. Appl. No. 16/548,027 titled "Apparatuses, Systems, and Methods for Analog Row Access Rate Determination" filed Aug. 22, 2019, pp. all.
U.S. Appl. No. 16/549,942 titled "Apparatuses and Methods for Lossy Row Access Counting" filed Aug. 23, 2019, pp. all.
U.S. Appl. No. 16/546,152 titled "Apparatuses and Methods for Analog Row Access Tracking" filed Aug. 20, 2019, pp. all.
U.S. Appl. No. 16/549,411 titled "Apparatuses and Methods for Dynamic Refresh Allocation" filed Aug. 23, 2019, pp. all.
U.S. Appl. No. 16/655,110 titled "Apparatuses and Methods for Dynamic Targeted Refresh Steals" filed Oct. 16, 2019, pp. all.
U.S. Appl. No. 17/154,945 titled "Apparatuses, Systems, and Methods for a Content Addressable Memory Cell" filed Jan. 21, 2021, pp. all.
U.S. Appl. No. 17/170,616 titled "Apparatuses, Systems, and Methods for Analog Row Access Rate Determination" filed Feb. 8, 2021, pp. all.
U.S. Appl. No. 17/168,036 titled "Apparatuses and Methods for Analog Row Access Tracking" filed Feb. 4, 2021, pp. all.

(56) References Cited

OTHER PUBLICATIONS

U.S. Appl. No. 17/301,533 titled "Semiconductor Device Having Cam That Stores Address Signals" filed Apr. 6, 2021, pp. all.
International Application No. PCT/US19/40169 titled "Apparatus and Methods for Triggering Row Hammer Address Sampling" filed Jul. 1, 2019, pp. all.
International Application No. PCT/US19/64028, titled "Semiconductor Device Performing Row Hammer Refresh Operation", dated Dec. 2, 2019, pp. all.
International Application No. PCT/US20/26689, titled "Apparatuses and Methods for Staggered Timing of Targeted Refresh Operations", dated Apr. 3, 2020, pp. all.
International Application No. PCT/US20/40077, titled "Apparatuses and Methods for Monitoring Word Line Accesses", dated Jun. 29, 2020, pp. all.
U.S. Appl. No. 16/788,657, titled "Semiconductor Device Performing Row Hammer Refresh Operation", dated Feb. 12, 2020, pp. all.
U.S. Appl. No. 15/881,256 entitled 'Apparatuses and Methods for Detecting a Row Hammer Attack With a Bandpass Filter' filed Jan. 26, 2018, pp. all.
U.S. Appl. No. 16/425,525 titled "Apparatuses And Methods For Tracking All Row Accesses" filed May 29, 2019, pp. all.
U.S. Appl. No. 16/427,105 titled "Apparatuses And Methods For Priority Targeted Refresh Operations" filed May 30, 2019, pp. all.
U.S. Appl. No. 16/427,140 titled "Apparatuses And Methods For Tracking Row Access Counts Between Multiple Register Stacks" filed May 30, 2019, pp. all.
U.S. Appl. No. 16/437,811 titled "Apparatuses, Systems, And Methods For Determining Extremum Numerical Values" filed Jun. 11, 2019, pp. all.
U.S. Appl. No. 16/537,981 titled "Apparatuses and Methods for Controlling Targeted Refresh Rates" filed Aug. 12, 2019, pp. all.
U.S. Appl. No. 17/007,069 titled "Apparatuses and Methods for Providing Refresh Addresses" filed Aug. 31, 2020, pp. all.
U.S. Appl. No. 17/153,555 titled "Apparatuses and Methods for Dynamically Allocated Aggressor Detection" filed Jan. 20, 2021, pp. all.
U.S. Appl. No. 17/201,941 titled "Apparatuses and Methods for Sketch Circuits for Refresh Binning" filed Mar. 15, 2021, pp. all.
U.S. Appl. No. 17/375,817 titled "Apparatuses and Methods for Monitoring Word Line Accesses" filed Jul. 14, 2021, pp. all.
U.S. Appl. No. 17/443,056 titled "Apparatuses and Methods for Multiple Row Hammer Refresh Address Sequences" filed Jul. 20, 2021, pp. all.
U.S. Appl. No. 17/444,925 titled "Apparatuses and Methods for Countering Memory Attacks" filed Aug. 12, 2021, pp. all.
U.S. Appl. No. 17/446,710 titled "Apparatuses, Systems, and Methods for Determining Extremum Numericalvalues" filed Sep. 1, 2021, pp. all.
U.S. Appl. No. 15/789,897, entitled "Apparatus and Methods for Refreshing Memory", filed Oct. 20, 2017; pp. all.
U.S. Appl. No. 15/796,340, entitled: "Apparatus and Methods for Refreshing Memory" filed Oct. 27, 2017; pp. all.
U.S. Appl. No. 16/012,679, titled "Apparatuses and Methods for Multiple Row Hammer Refresh Address Sequences", filed Jun. 19, 2018, pp. all.
U.S. Appl. No. 16/020,863, titled "Semiconductor Device", filed Jun. 27, 2018, pp. all.
U.S. Appl. No. 16/112,471 titled "Apparatuses and Methods for Controlling Refresh Operations" filed Aug. 24, 2018, pp. all.
U.S. Appl. No. 16/160,801, titled "Apparatuses and Methods for Selective Row Refreshes" filed Oct. 15, 2018, pp. all.
U.S. Appl. No. 16/176,932, titled "Apparatuses and Methods for Access Based Refresh Timing", filed Oct. 31, 2018, pp. all.
U.S. Appl. No. 16/208,217, titled "Semiconductor Device Performing Row Hammer Refresh Operation", filed Dec. 3, 2018, pp. all.
U.S. Appl. No. 16/230,300, titled "Apparatuses and Methods for Staggered Timing of Targeted Refresh Operations" filed Dec. 21, 2018, pp. all.
U.S. Appl. No. 16/231,327 titled "Apparatuses and Methods for Selective Row Refreshes", filed Dec. 21, 2018, pp. all.
U.S. Appl. No. 16/237,291, titled "Apparatus and Methods for Refreshing Memory", filed Dec. 31, 2018, pp. all.
U.S. Appl. No. 16/290,730, titled "Semiconductor Device Performing Row Hammer Refresh Operation", filed Mar. 1, 2019, pp. all.
U.S. Appl. No. 16/374,623, titled "Semiconductor Device Performing Row Hammer Refresh Operation", filed Apr. 3, 2019, pp. all.
U.S. Appl. No. 16/411,698 title "Semiconductor Device" filed May 14, 2019, pp. all.
U.S. Appl. No. 16/427,330 titled "Apparatuses and Methods for Storing Victim Row Data" filed May 30, 2019, pp. all.
U.S. Appl. No. 16/431,641 titled "Apparatuses and Methods for Controlling Steal Rates" filed Jun. 4, 2019, pp. all.
U.S. Appl. No. 16/682,606, titled "Apparatuses And Methods For Distributing Row Hammer Refresh Events Across A Memory Device", filed Nov. 13, 2019, pp. all.
U.S. Appl. No. 17/102,266, titled "Apparatuses and Methods for Tracking Word Line Accesses", dated Nov. 23, 2020, pp. all.
U.S. Appl. No. 15/876,566 entitled 'Apparatuses and Methods for Calculating Row Hammer Refresh Addresses in a Semiconductor Device' filed Jan. 22, 2018, pp. all.
International Application for Application No. PCT/US20/32684, titled "Apparatuses, Systems, and Methods for a Content Addressable Memory Cell", dated May 13, 2020, pp. all.
U.S. Appl. No. 15/656,084, titled "Apparatuses And Methods For Targeted Refreshing Of Memory", filed Jul. 21, 2017, pp. all.
U.S. Appl. No. 16/459,520 titled "Apparatuses and Methods for Monitoring Word Line Accesses", filed Jul. 1, 2019, pp. all.
PCT Application No. PCT/US18/55821 "Apparatus and Methods for Refreshing Memory" filed Oct. 15, 2018., pp. all.
U.S. Appl. No. 15/715,846, entitled "Semiconductor Device", filed Sep. 26, 2017, pp. all.
U.S. Appl. No. 15/888,993, entitled "Apparatuses and Methods for Controlling Refresh Operations", filed Feb. 5, 2018, pp. all.
U.S. Appl. No. 16/190,627 titled "Apparatuses and Methods for Targeted Refreshing of Memory" filed Nov. 14, 2018, pp. all.
U.S. Appl. No. 16/459,507 titled "Apparatuses and Methods for Adjusting Victim Data", filed Jul. 1, 2019, pp. all.
U.S. Appl. No. 15/281,818, entitled: "Semiconductor Device" filed Sep. 30, 2016, pp. all.
Kim, et al., "Flipping Bits in MemoryWithout Accessing Them: An Experimental Study of DRAM Disturbance Errors", IEEE, Jun. 2014, 12 pgs.
Stout, Thomas et al., "Voltage Source Based Voltage-to-Time Converter", IEEE, downloaded Jul. 2020, p. all.
[English Abstract] Zheng, Bin , et al., "Design of Built-in DRAM for TFT-LCD Driver Chip LCD and display," Issue 4, Aug. 15, 2009; pp. all.

\* cited by examiner

APPARATUSES AND METHODS FOR TRACKING VICTIM ROWS

CROSS REFERENCE TO RELATED APPLICATION(S)

This application is a continuation of U.S. patent application Ser. No. 16/428,625 filed May 31, 2019 and issued as U.S. Pat. No. 11,158,364 on Oct. 16, 2021. The aforementioned application, and issued patent, is incorporated herein by reference, in its entirety, for any purpose.

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. Typically, memory cells are arranged in an array that includes a series of rows referred to as word lines and columns referred to as bit lines. An automatic refresh (e.g., auto-refresh) operation may be carried out where the memory cells of one or more word lines are periodically refreshed to preserve data stored in the memory cells. Repeated access to a particular memory cell or group of memory cells, such as a word line, may cause an increased rate of data degradation in nearby memory cells (e.g., adjacent word lines). This repeated access is often referred to as a 'row hammer.' To preserve the data in nearby memory cells, the word lines of the nearby memory cells may need to be refreshed at a rate higher than a rate of the auto-refresh. Targeted refresh operations may be performed on the nearby memory cells, but the targeted refresh operations may come at a cost to the auto-refresh operations. As the auto-refresh rate is reduced by targeted refresh operations, data degradation could occur in memory cells unaffected by the row hammer. Increasing the auto-refresh rate to compensate for the targeted refreshes may cause the memory to use more power and/or increase delays between memory access operations (e.g., read, write). Accordingly, minimizing the targeted refresh operations is desired.

DETAILED DESCRIPTION

Figure 1:
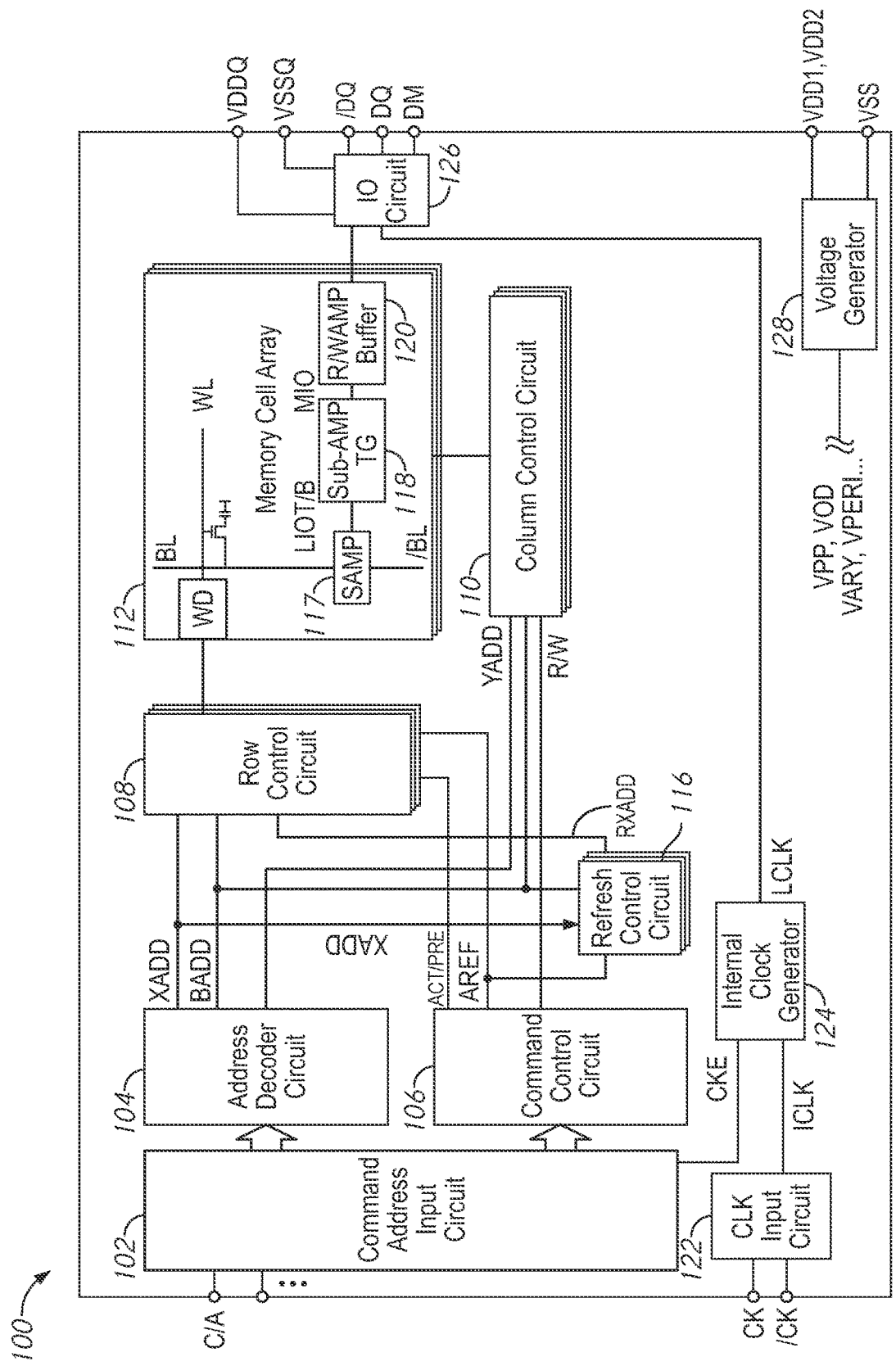
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a plurality of memory cells. The memory cells may store information (e.g., as one or more bits), and may be organized at the intersection of word lines (rows) and bit lines (columns). A number of word lines and bit lines may be organized into a memory bank. A memory device may include a number of different memory banks. The memory device may receive one or more command signals which may indicate operations in one or more of the banks of one or more memory packages. The memory device may enter a refresh mode, in which word lines in one or more of the memory banks are refreshed.

Information in the memory cells may decay over time. The memory cells may be refreshed on a row-by-row basis to preserve information in the memory cells. During a refresh operation, the information in one or more word lines may be rewritten back to the respective word lines to restore an initial value of the information. Repeated access to a given word line (e.g., an aggressor word line) may cause an increased rate of information decay in one or more physically neighboring word lines (e.g., victim word lines). In some applications, victim word lines may be considered to be the word lines which are physically adjacent to the aggressor word line. For example, victim word lines may be located on either side of the aggressor word line (e.g., R+1 and R−1) as well as the word lines which are adjacent to the adjacent word lines (e.g., R+2 and R−2).

Accesses to different word lines of the memory may be tracked in order to determine if a word line is an aggressor word line. The row address of the accessed word lines and/or aggressor word lines may be stored in a register or other storage device in the memory. If a word line is determined to be an aggressor word line, victim word lines may be determined based, at least in part, on a row address of the aggressor word line. The victim word lines (e.g., R+1, R−1, R+2, and R−2) may be refreshed as part of a targeted (e.g., 'row hammer') refresh operation. There may be four victim row addresses for each aggressor row address in some applications.

When the aggressor word lines are tracked, the victim word lines associated with the aggressor word line must be refreshed during one or more targeted refresh operations. In some applications, this may require refreshing four word lines, which may require 'stealing' four refreshes from the auto-refresh operation. However, not all of the victim word lines may require immediate refreshing to preserve data. Furthermore, a victim word line may be a victim based on its proximity to more than one aggressor word line. Thus, the victim word line may be refreshed multiple times by targeted refresh operations based on victim determinations from the multiple aggressor word lines. This may result in the victim word line being refreshed more often than necessary to preserve data in the victim word line. In some applications, it may be desirable to reduce the number of unnecessary targeted refresh operations to reduce the impact on the auto-refresh rate and/or power consumption by a memory device.

The present disclosure is drawn to apparatuses and methods for tracking victim row addresses. The addresses of victim word lines may be determined based on word lines that are accessed in a memory. For example, row addresses provided with activation, read, and write commands. The victim addresses may be tracked (e.g., stored) and associated with a count value. In some embodiments, the count value may indicate a number of times a row address is determined to be a victim row address. For example, when a row address is determined to be a victim row address of an accessed word line. The count value for a victim row address may be adjusted every time the same victim row address is determined based on an accessed row address. When the count value for a victim row address reaches a threshold value, the victim word line associated with the victim row address may be refreshed during a targeted refresh operation to preserve data stored in the victim word line. After the victim word line has been refreshed, the count value may be reset. If no victim word line has a count value at or above the threshold value, an auto-refresh operation may be performed instead of a targeted refresh operation in some embodiments. This may reduce the steal rate in some applications. When a victim word line is accessed or refreshed by an auto-refresh operation, the count value may also be reset. This may reduce unnecessary refreshes of victim word lines in some applications. The data in more distant victim word lines may be less prone to data degradation than closer victim word lines. As a result, victim word lines closer to an aggressor word line (e.g., R+/−1) may be refreshed at a higher rate than more distant victim word lines (e.g., R+/−2). For example, in some embodiments of the disclosure, the count values for the victim row addresses may be adjusted for the closer victim word lines (e.g., R+/−1) by a greater amount than counts for the victim row addresses of more distant victim word lines (e.g., R+/−2).

FIG. 1 is a block diagram showing an overall configuration of a semiconductor device according to at least one embodiment of the disclosure. The semiconductor device 100 may be a semiconductor memory device, such as a DRAM device integrated on a single semiconductor chip.

The semiconductor device 100 includes a memory array 112. In some embodiments, the memory array 112 may include of a plurality of memory banks. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row control circuit 108 and the selection of the bit lines BL and /BL is performed by a column control circuit 110. In some embodiments, there may be a row control circuit 108 and column control circuit 110 for each of the memory banks.

The bit lines BL and /BL are coupled to a respective sense amplifier (SAMP) 117. Read data from the bit line BL or /BL is amplified by the sense amplifier SAMP 117, and transferred to read/write amplifiers 120 over complementary local data lines (LIOT/B), transfer gate (TG) 118, and complementary main data lines (MIO). Conversely, write data outputted from the read/write amplifiers 120 is transferred to the sense amplifier 117 over the complementary main data lines MIO, the transfer gate 118, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to a clock input circuit 122. The external clocks may be complementary. The clock input circuit 122 generates an internal clock ICLK based on the CK and /CK clocks. The ICLK clock is provided to the command control circuit 106 and to an internal clock generator circuit 124. The internal clock generator circuit 124 provides various internal clocks LCLK based on the ICLK clock. The LCLK clocks may be used for timing operation of various internal circuits. The internal data clocks LCLK are provided to the input/output circuit 126 to time operation of circuits included in the input/output circuit 126, for example, to data receivers to time the receipt of write data.

The C/A terminals may be supplied with memory addresses. The memory addresses supplied to the C/A terminals are transferred, via a command/address input circuit 102, to an address decoder circuit 104. The address decoder circuit 104 receives the address and supplies a decoded row address XADD to the row control circuit 108 and supplies a decoded column address YADD to the column control circuit 110. The row address XADD may be used to specify one or more word lines WL of the memory array 112 and the column address YADD may specify one or more bit lines BL of the memory array 112. The address decoder circuit 104 may also provide a bank address BADD, which specifies a particular bank of the memory. The bank address BADD may be provided to the row control circuit 108 and/or column control circuit 110 to direct access operations to one or more of the banks. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and/or bank address BADD to indicate the memory cell(s) to be accessed.

The commands may be provided as internal command signals to a command control circuit 106 via the command/address input circuit 102. The command control circuit 106 includes circuits to decode the internal command signals to generate various internal signals and commands for performing operations. For example, the command control circuit 106 may provide a row command signal to select a word line and a column command signal to select a bit line.

The device 100 may receive an access command which is a row activation command ACT. When the row activation command ACT is received, a row address XADD is timely supplied with the row activation command ACT.

The device 100 may receive an access command which is a read command. When a read command is received, a bank address BADD and a column YADD address are timely supplied with the read command, read data is read from memory cells in the memory array 112 corresponding to the row address XADD and column address YADD. The read command is received by the command control circuit 106, which provides internal commands so that read data from the memory array 112 is provided to the read/write amplifiers 120. The read data is output to outside from the data terminals DQ via the input/output circuit 126.

The device 100 may receive an access command which is a write command. When the write command is received, a bank address and a column address are timely supplied with the write command, write data supplied to the data terminals DQ is written to a memory cells in the memory array 112 corresponding to the row address and column address. The write command is received by the command control circuit 106, which provides internal commands so that the write data is received by data receivers in the input/output circuit 126. Write clocks may also be provided to the external clock terminals for timing the receipt of the write data by the data receivers of the input/output circuit 126. The write data is supplied via the input/output circuit 126 to the read/write amplifiers 120, and by the read/write amplifiers 120 to the memory array 112 to be written into the memory cell MC.

The device 100 may also receive commands causing it to carry out refresh operations. A refresh signal AREF may be a pulse signal which is activated when the command control circuit 106 receives a signal which indicates a refresh mode. In some embodiments, the refresh command may be externally issued to the memory device 100. In some embodiments, the refresh command may be periodically generated by a component of the device. In some embodiments, when an external signal indicates a refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh control circuit 116 supplies a refresh row address RXADD to the row control circuit 108, which may refresh one or more word lines WL indicated by the refresh row address RXADD. The refresh control circuit 116 may control a timing of the refresh operation based on the refresh signal AREF. In some embodiments, responsive to an activation of AREF, the refresh control circuit 116 may generate one or more activations of a pump signal, and may generate and provide a refresh address RXADD for each activation of the pump signal (e.g., each pump).

One type of refresh operation may be an auto-refresh operation. Responsive to an auto-refresh operation the memory bank may refresh a word line or a group of word lines of the memory, and then may refresh a next word line or group of word lines of the memory bank responsive to a next auto-refresh operation. The refresh control circuit 116 may provide a refresh address RXADD which indicates a word line or a group of word lines in the memory bank. The refresh control circuit 116 may generate a sequence of refresh addresses RXADD such that over time the auto-refresh operation may cycle through all the word lines WL of the memory bank. The timing of refresh operations may be such that each word line is refreshed with a frequency based, at least in part, on a normal rate of data degradation in the memory cells (e.g., auto-refresh rate).

Another type of refresh operation may be a targeted refresh operation. As mentioned previously, repeated access to a particular word line of memory (e.g., an aggressor word line) may cause an increased rate of decay in neighboring word lines (e.g., victim word lines) due, for example, to electromagnetic coupling between the word lines. In some embodiments, the victim word lines may include word lines which are physically adjacent to the aggressor word line. In some embodiments, the victim word lines may include word liens further away from the aggressor word line. Information in the victim word line may decay at a rate such that data may be lost if not refreshed before the next auto-refresh operation of that word line. In order to prevent information from being lost, it may be necessary to identify aggressor word lines and then carry out a targeted refresh operation where a refresh address RXADD associated with one or more associated victim word lines is refreshed.

The refresh address control circuit 116 may selectively output a targeted refresh address (e.g., a victim row address) or an automatic refresh address (e.g., auto-refresh address) as the refresh address RXADD. The auto-refresh addresses may be a sequence of addresses which are provided based on activations of the auto-refresh signal AREF. The refresh address control circuit 116 may cycle through the sequence of auto-refresh addresses at a rate determined by AREF.

The refresh address control circuit 116 may also determine targeted refresh addresses which are addresses that require refreshing (e.g., victim row addresses corresponding to victim word lines) based on the access pattern of nearby addresses (e.g., aggressor row addresses corresponding to aggressor word lines) in the memory array 118. The refresh address control circuit 116 may selectively use one or more signals of the device 100 to calculate the refresh address RXADD. For example, the refresh address RXADD may be calculated based on the row addresses XADD provided by the address decoder circuit 104. The refresh address control circuit 116 may receive the current value of the row address XADD provided by the address decoder circuit 104 and determine a targeted refresh address based on one or more of the received addresses.

The refresh address RXADD may be provided with a timing based on a timing of the refresh signal AREF. This may be referred to as the auto-refresh rate. The refresh address control circuit 116 may have time slots corresponding to the timing of AREF, and may provide one or more refresh addresses RXADD during each time slot. In some embodiments, a targeted refresh address may be issued in a time slot which would otherwise have been assigned to an auto-refresh address (e.g., "steal"). In some embodiments, certain time slots may be reserved for targeted refresh addresses. These time slots may be referred to as a targeted refresh intervals or targeted refresh time slots. The time period between time slots reserved for targeted refresh addresses may be referred to as the targeted refresh rate or steal rate. As the number of targeted refresh time slots increases, the steal rate increases, and the effective auto-refresh rate decreases. In some embodiments, the refresh address control circuit 116 may determine whether to provide a targeted refresh address, not provide an address during that time slot, or provide an auto-refresh address instead during the time slot. Thus, in some embodiments, the steal rate may not be constant over time.

The targeted refresh address may be based on the row addresses XADD received from the address decoder circuit 104. For example, the refresh control circuit 116 may determine row addresses for one or more victim word lines (e.g., victim row addresses) based on the row address XADD. The victim row addresses may be stored along with corresponding count values. Each time a row is determined to be a victim word line based on the row address XADD, the count value of the corresponding row address may be adjusted (e.g., increased). Once a count value reaches a threshold value, the corresponding victim row address may be provided as a targeted refresh address to be refreshed during a targeted refresh interval. In some cases, multiple count values may reach the threshold value between targeted refresh intervals. In this case, the victim row addresses may be stored in a queue and sequentially provided as targeted refresh addresses during sequential targeted refresh intervals. In some applications, multiple victim row addresses may be provided per targeted refresh interval. After the victim word line associated with the victim row address has been refreshed, the count value associated with the victim row address may be reset (e.g., set to a value of zero). If none of the count values have reached the threshold value, the refresh control circuit 116 may supply one or more auto-refresh addresses during the targeted refresh interval. In some embodiments, the row address XADD and/or the auto-refresh address may be compared to the victim row addresses stored in the refresh control circuit 116. If the row address or auto-refresh address matches a victim row address, the count value for the victim row address may be reset.

The power supply terminals are supplied with power supply potentials VDD and VSS. The power supply potentials VDD and VSS are supplied to an internal voltage generator circuit 128. The internal voltage generator circuit 128 generates various internal potentials VPP, VOD, VARY, VPERI, and the like based on the power supply potentials VDD and VSS supplied to the power supply terminals. The internal potential VPP is mainly used in the row decoder circuit 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 126. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 126 does not propagate to the other circuit blocks.

Figure 2:
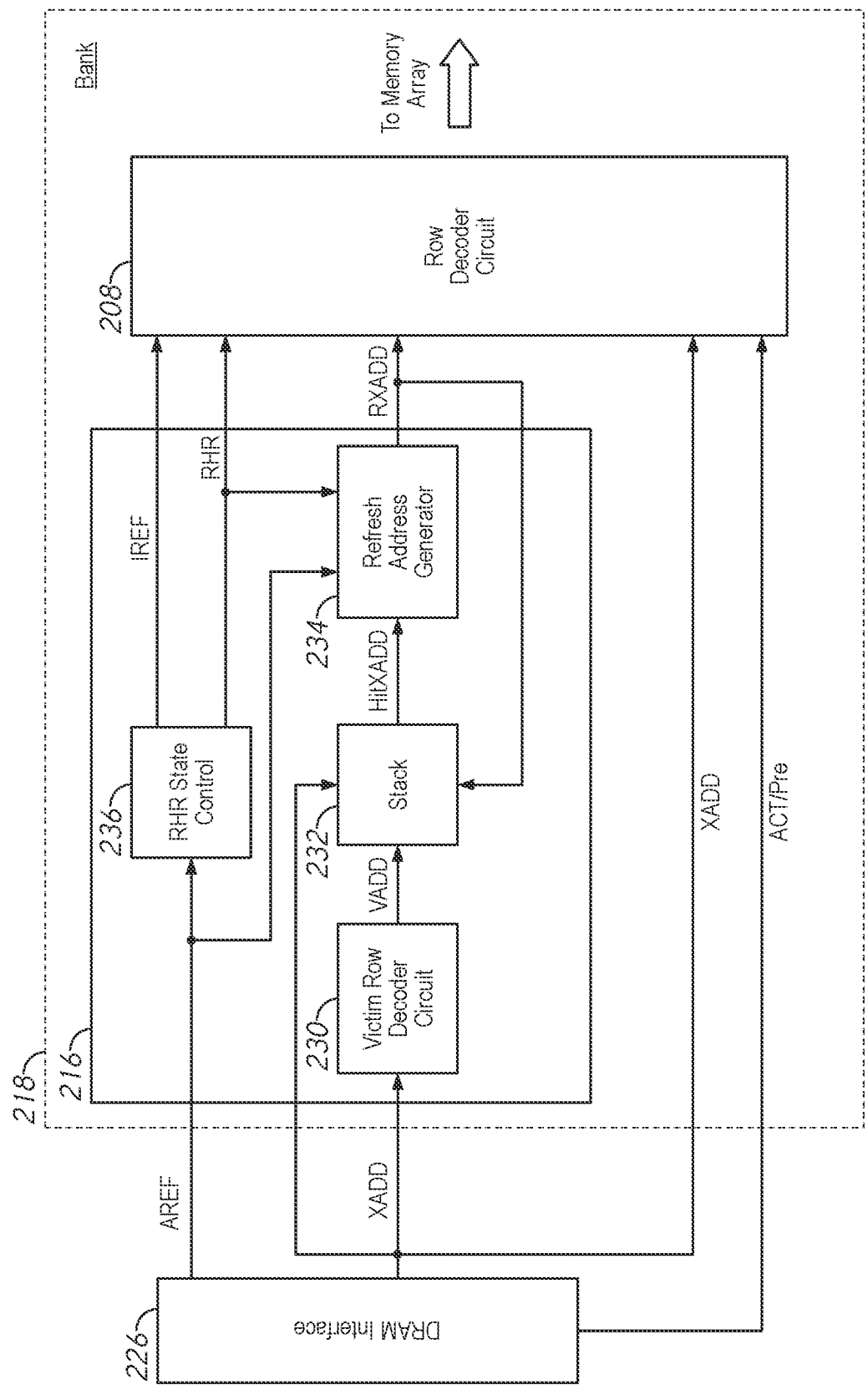
FIG. 2 is a block diagram of a refresh control circuit according to an embodiment of the present disclosure.

FIG. 2 is a block diagram of a refresh control circuit according to an embodiment of the present disclosure. The dashed line is shown to represent that in certain embodiments, each of the components (e.g., the refresh address control circuit 216 and row decoder circuit 208) may correspond to a particular bank 218 of memory, and that these components may be repeated for each of the banks of memory. In some embodiments, the components shown within the dashed line may be positioned in each of the memory banks 218. Thus, there may be multiple refresh address control circuits 216 and row decoder circuit 208. For the sake of brevity, only components for a single bank will be described. In some embodiments, memory bank 218 may be included in memory bank 112 shown in FIG. 1. In some embodiments, refresh control circuit 216 may be included in refresh control circuit 116 shown in FIG. 1. In some embodiments, row decoder circuit 208 may be included in row control circuit 108.

A DRAM interface 226 may provide one or more signals to a refresh control circuit 216 and row decoder circuit 208. The refresh control circuit 216 may include a victim row decoder circuit 230, a stack 232, a row hammer refresh (RHR) state control 236 and a refresh address generator 234. The DRAM interface 226 may provide one or more control signals, such as a refresh signal AREF, and a row address XADD.

The DRAM interface 226 may represent one or more components which provides signals to components of the bank 218. In some embodiments, the DRAM interface 226 may represent a memory controller coupled to the semiconductor memory device (e.g., device 100 of FIG. 1). In some embodiments, the DRAM interface 226 may represent components such as the command address input circuit 102, the address decoder circuit 104, and/or the command control circuit 106 of FIG. 1. The DRAM interface 226 may provide a row address XADD, the auto-refresh signal AREF, an activation signal ACT, and/or a precharge signal PRE. The auto-refresh signal AREF may be a periodic signal which may indicate when a refresh operation is to occur. The activation signal ACT may be provided to activate a given bank 218 of the memory. The row address XADD may be a signal including multiple bits (which may be transmitted in series or in parallel) and may correspond to a specific word line of a memory bank (e.g., the memory bank activated by ACT/Pre).

The victim row decoder circuit 230 may receive the current row address XADD. In some embodiments, based on the row address XADD, the victim row decoder circuit 230 may determine one or more victim row addresses VADD corresponding to victim word lines. Thus, the word lines in close proximity to the aggressor word line associated with row address XADD are referred to herein as victim word lines. The one or more victim row addresses VADD determined by the victim row decoder circuit 230 may be provided to the stack 232 for storage. For example, the victim row decoder circuit 230 may determine addresses for the R+1 and R−1 victim word lines, that is, those word lines physically adjacent to a word line associated with the row address XADD. In some embodiments, the victim row decoder circuit 230 may determine addresses for the R+2 and R−2 word lines associated with the row address XADD, that is victim word lines adjacent to the R+/−1 word lines. In some embodiments, more distant victim word lines may be calculated. For a given row address XADD, there may not be an even number of victim word lines. For example, if an aggressor word line corresponding to row address XADD is at a physical edge of a memory cell array, there may be only one R+1/R−1 victim word line in some applications.

The row address XADD may change as the DRAM interface 226 directs access operations (e.g., read and write operations) to different rows of the memory cell array (e.g., memory cell array 118 of FIG. 1). In some embodiments, the victim row decoder circuit 230 may calculate victim row addresses for every received row address XADD. In other embodiments, the victim row decoder circuit 230 may calculate victim row addresses responsive to an active sample signal provided by a sample timing generator (not shown). In some embodiments, the sample signal may be a pulse signal. That is, it may transition to an active state and return to an inactive state after a time period (e.g., half a clock cycle, one clock cycle). The sample generator may regularly, randomly, or pseudo-randomly vary a time interval between pulses of the sample signal.

The stack 232 may be configured to store the victim row addresses VADD received from the victim row decoder circuit 230. The stack 232 may further store a count value for each victim row address. Each time a particular victim row address is provided to the stack 232, the count value for the particular victim row address may be adjusted, for example, the count value may be increased. In some embodiments, the amount the count value is adjusted may be based, at least in part, on the proximity of the victim word line associated with the victim row address to an aggressor word line associated with the row address XADD. That is, a first victim row address may be associated with a first victim word line having a first distance to an aggressor word line and a second victim row address may be associated with a second victim word line having a second distance to the aggressor word line and the second distance is greater than the first distance. The count value for the first victim row address may be adjusted by a greater amount than the count value for the second victim row address. For example, if a victim word line is located immediately next to the aggressor word line (e.g., R+1 or R−1), the count value may be increased by ten, whereas if the victim word line is more distant (e.g., R+2 or R−2), the count value may be increased by one. Other differences in adjusting the count value based on proximity may also be used. In some embodiments, the victim row decoder 230 may indicate a proximity associated with a provided victim row address and/or an amount to adjust the count value of a victim address in the stack 232. When a count value stored in the stack 232 reaches a threshold value, the stack 232 may provide the corresponding victim row address to the refresh address generator 234 as a targeted address HitXADD.

The RHR state control 236 may control the timing of targeted refresh operations (e.g., the steal rate). The RHR state control 236 may provide an active signal RHR to indicate that a targeted refresh (e.g., a refresh of the victim word lines), also referred to as a row hammer refresh, should occur. The RHR state control 236 may also provide an active internal refresh signal IREF, to indicate that an auto-refresh should occur. Responsive to an activation of RHR, the refresh address generator 234 may provide a refresh address RXADD, which may be an auto-refresh address or may be a victim address for a victim word line corresponding to the targeted address HitXADD. The row decoder circuit 208 may perform a targeted refresh operation responsive to the refresh address RXADD and the signal RHR. The row decoder circuit 208 may perform an auto-refresh operation based on the refresh address RXADD and the active internal refresh signal IREF. In some embodiments, the row decoder circuit 208 may receive the auto-refresh signal AREF provided by the DRAM interface 226, and the internal refresh signal IREF may not be used.

The RHR state control 236 may receive the auto-refresh signal AREF and provide the row hammer refresh signal RHR. The auto-refresh signal AREF may be periodically generated and may be used to control the timing of refresh operations. The memory device may carry out a sequence of auto-refresh operations in order to periodically refresh the rows of the memory device. The RHR signal may be generated in order to indicate that a particular targeted row address should be refreshed instead of an address from the sequence of auto-refresh addresses. For example, if a count value associated with a victim row address has reached or exceeded a threshold value. The RHR state control 236 may use internal logic to provide the RHR signal. In some embodiments, the RHR state control 236 may provide the RHR signal based on certain number of activations of AREF (e.g., every $4^{th}$ activation of AREF). The RHR state control 236 may also provide an internal refresh signal IREF, which may indicate that an auto-refresh operation should take place. In some embodiments, the signals RHR and IREF may be generated such that they are not active at the same time (e.g., are not both at a high logic level at the same time).

The refresh address generator 234 may receive the AREF signal, the row hammer refresh signal RHR and the targeted row address HitXADD. The targeted row address HitXADD may represent a victim word line. The refresh address generator 234 may determine whether a targeted row address HitXADD should be provided or an auto-refresh address as the refresh address RXADD. The refresh address generator 234 may determine the value of the refresh address RXADD based, at least in part, on the row hammer refresh signal RHR. In some embodiments, when the signal RHR is not active, the refresh address generator 234 may provide one of a sequence of auto-refresh addresses. When the signal RHR is active, the refresh address generator 234 may check if a targeted row address is available and if so, provide the targeted row address HitXADD, as the refresh address RXADD. If no targeted row address HitXADD is available (e.g., none of the count values stored in the stack have reached the threshold value), the refresh address generator 234 may provide an auto-refresh address as the refresh address RXADD, even if the RHR signal is active. In other embodiments, if no targeted row address HitXADD is available, no refresh operation may be performed. The refresh address RXADD may be provided to the stack 232, and a count value associated with a victim row address matching the refresh address RXADD may be reset.

The row decoder circuit 208 may perform one or more operations on the memory array (not shown) based on the received signals and addresses. For example, responsive to the activation signal ACT and the row address XADD (and IREF and RHR being at a low logic level), the row decoder circuit 208 may direct one or more access operations (for example, a read operation) on the specified row address XADD. Responsive to the RHR signal being active, the row decoder circuit 208 may refresh the refresh address RXADD.

Figure 3:
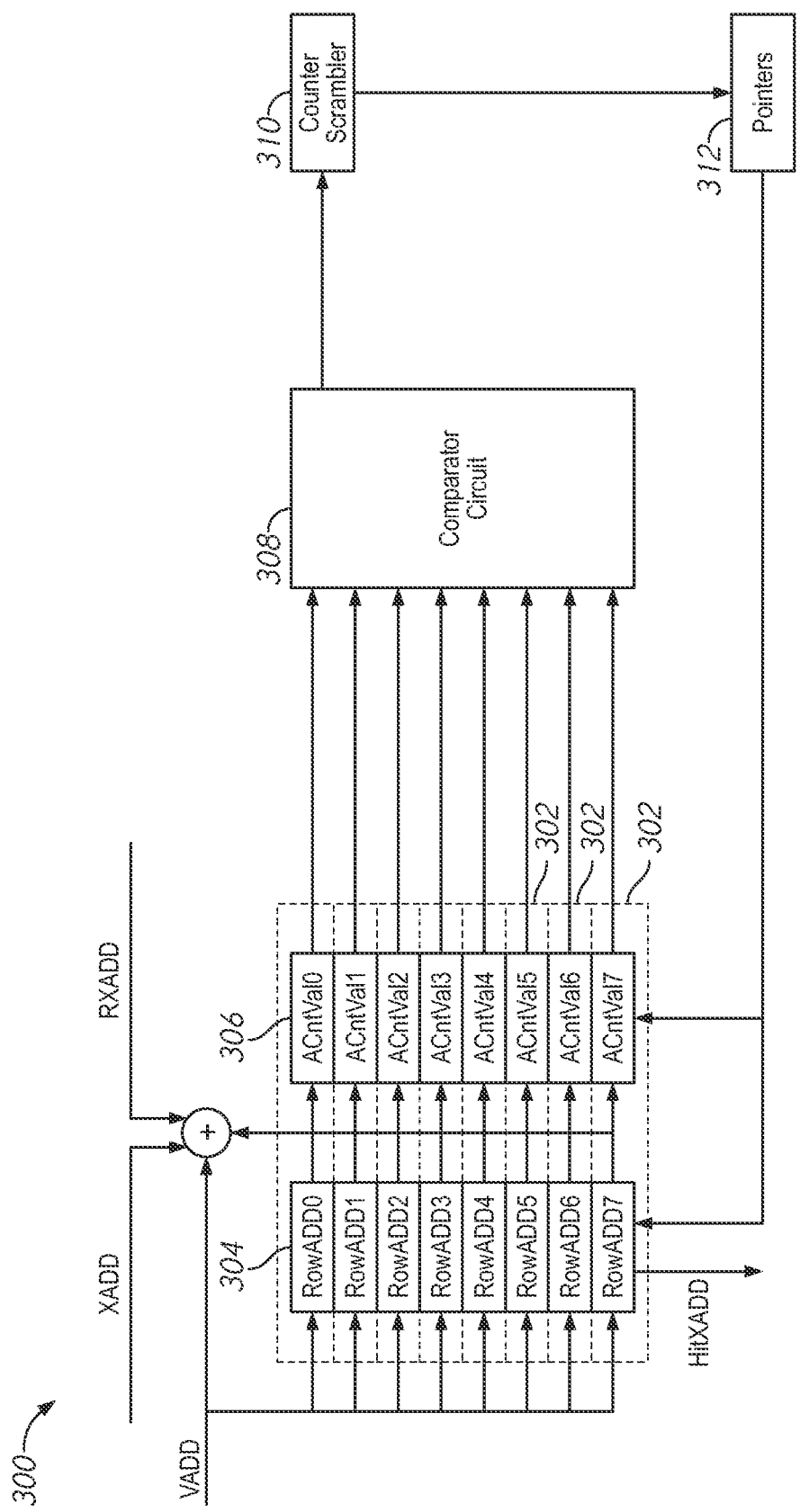
FIG. 3 is a block diagram of a stack according to an embodiment of the present disclosure.

FIG. 3 is a block diagram of a stack according to an embodiment of the present disclosure. In some embodiments, the stack 300 may be included in stack 232 of FIG. 2. The stack 300 may be a content addressable memory (CAM) address stack in some embodiments. The stack 300 may include multiple registers 302, each of which may have corresponding fields 304, 306. In the embodiment shown in FIG. 3, each register includes a field 304 configured to store a victim row address (Victim Row Address 0-7) and a field 306 configured to store a corresponding count value (Count Value 0-7). The fields 306 storing the count values may be coupled to a comparator 308 which may be coupled to pointers 312 through a counter scrambler 310. The fields 304 storing victim row addresses may be coupled to a refresh address generator (not shown in FIG. 3), such as refresh address generator 234 shown in FIG. 2, and provide a targeted row address HitXADD to the address generator. While the example in FIG. 3 shows eight registers 302 in the stack 300, it is understood that the stack could include fewer or more registers. For example, the stack 300 could have one hundred registers. In another example, the stack 300 could have four hundred registers.

Each time a victim row address VADD is provided (e.g. from a victim row decoder circuit, such as victim row decoder circuit 230 in FIG. 2), the current victim row address VADD may be compared to the fields 304. If the current victim row address VADD is already stored in one of the registers 302, then the count value in field 306 associated with the matching victim row address in field 304 may be adjusted. In some embodiments, a magnitude the count value is adjusted may be proportional to a proximity of the corresponding victim word line to an aggressor word line corresponding to row address XADD. If the current victim row address VADD is not already stored in one of the registers 302, it may be added to the registers 302. If there is an open register (e.g., a register without a victim row address) then the victim row address VADD may be stored in the open register. If there is not an open register, then the register 302 associated with the count value which has the lowest value (as indicated by the pointers 312) may have its row address replaced with the current victim address VADD and count value reset.

The stack 300 may receive row address XADD and refresh address RXADD. Row address XADD may be received during a memory access operation (e.g., activation, read, write) and refresh address RXADD may be received during a refresh operation. The row address XADD and refresh address RXADD may be compared to fields 304. If the row address XADD or refresh address RXADD is stored in one of the registers 302, the count value in field 306 of the register 302 may be reset (e.g., set to zero). Resetting the count value for victim row addresses after they have been accessed or refreshed may reduce a number of unnecessary refresh operations on victim word lines.

The comparator 308 may compare the count values in fields 306 to a threshold value to determine if a count value for a victim row address has matched or exceeded the threshold value (e.g., 2,000, 3,000, 5,000). In some embodiments, the comparator 308 may further compare the count values to determine which victim row address is associated with the lowest count value. The fields 306 corresponding to the minimum count value and count values that meet or exceed the threshold value may be provided to a counter scrambler 310, which may match the above threshold value fields and minimum count value field to their respective associated row address fields 304. The pointers 312 may point to the victim row addresses in fields 304 associated with count values at or above the threshold value and may point to the fields 304 associated with the minimum count value in fields 306. The threshold value pointer(s) may be used to provide the corresponding victim row address(es) to the refresh address generator as HitXADD. When a targeted refresh operation is carried out based on the address HitXADD, the count value in field 306 associated with the victim row address may be reset. The minimum count value pointer may be used to overwrite a register 302 when a new victim row address VADD is received and there is no open register 302 to store it in.

Although increasing the count value to track a number of times a word line is a victim of an aggressor word line has been described, other methods of adjusting the count value may be used. For example, the count value may start at an initial value (e.g., 3,000) and the count value may be decreased each time the victim row address VADD is received by the stack 300. Once the count value reaches zero, the corresponding victim row address may be provided as HitXADD.

Figure 4:
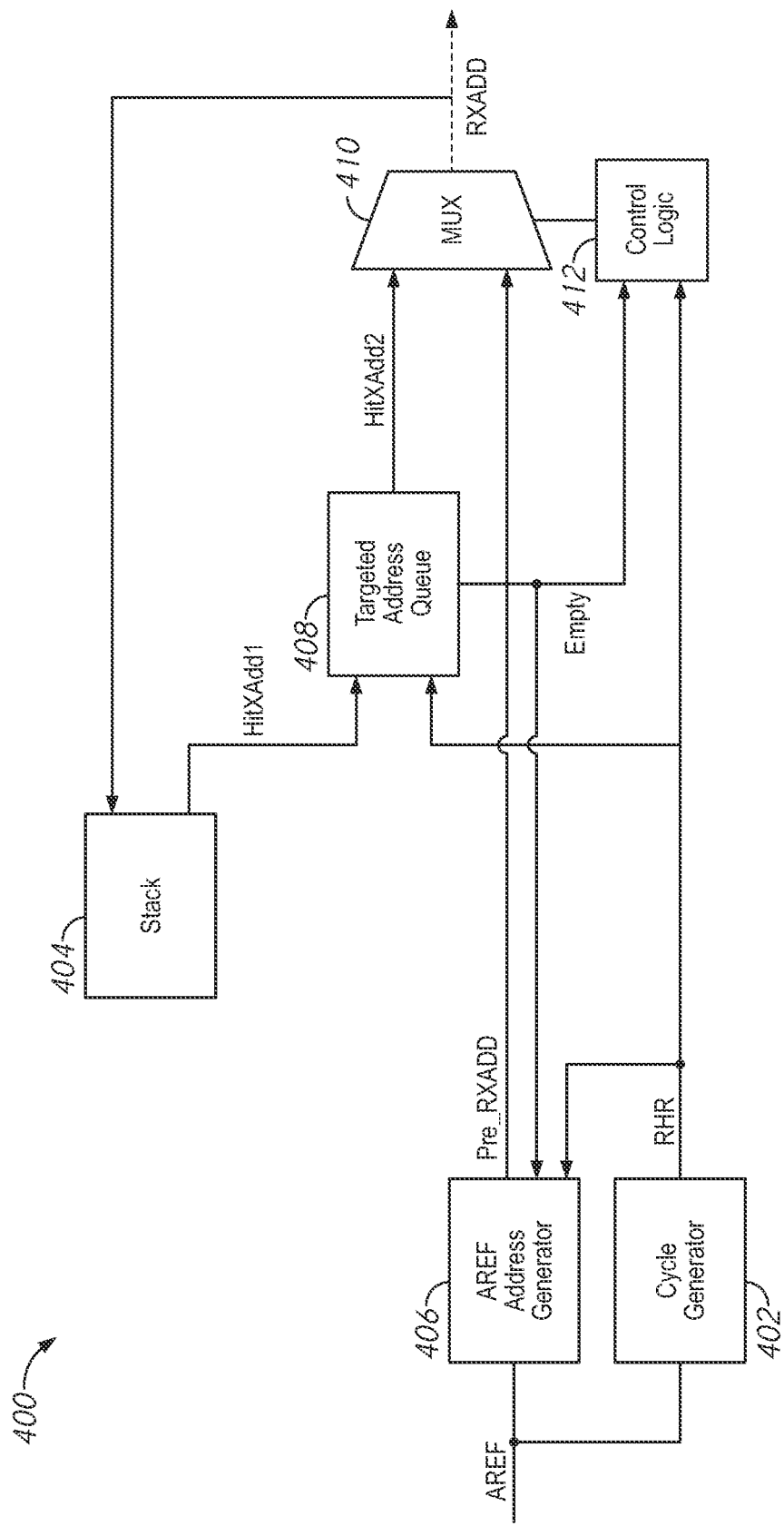
FIG. 4 is a block diagram of a refresh address generator according to an embodiment of the present disclosure.

FIG. 4 is a block diagram of a refresh address generator according to an embodiment of the present disclosure. In some embodiments, the refresh address generator 400 may be used to implement the refresh address generator 234 of FIG. 2. The refresh address generator 400 may include an auto-refresh address generator 406 (AREF address generator), a targeted address queue 408, a multiplexer 410, and control logic 412. The refresh address generator 400 may receive a command signal RHR from cycle generator 402. The cycle generator 402 may include RHR state control 236 in some embodiments. The refresh address generator 400 receives the targeted address HitXADD1 from a stack 404 and the auto-refresh signal AREF. In some embodiments, stack 404 may include stack 232 and HitXADD1 may include HitXADD shown in FIG. 2. In some embodiments, stack 404 may include stack 300 and HitXADD1 may include HitXADD shown in FIG. 3. The refresh address generator 400 provides either an auto-refresh address Pre_RXADD or a victim row address HitXADD2 based on targeted address HitXADD1 as the refresh address RXADD. The refresh address RXADD may be provided to the stack 404 in some embodiments. This may allow the count values associated with row addresses stored in the stack 404 that match the refresh address RXADD to be reset.

The refresh cycle generator 402 determines if an auto-refresh operation or a targeted refresh operation will occur. The refresh cycle generator 402 receives the refresh signal AREF and selectively provides an active command signal RHR in response. The active command signal RHR may indicate a targeted refresh operation is to be performed (e.g., a targeted refresh interval). The refresh cycle generator 402 may periodically provide the active command signal RHR based on a rate of the auto-refresh signal AREF.

The AREF address generator 406 generates an auto-refresh address Pre_RXADD in response to the refresh signal AREF. The auto-refresh address Pre_RXADD may be part of a sequence of addresses to be refreshed as part of an auto-refresh operation. The refresh address generator 406 may update the current auto-refresh address Pre_RXADD to a next address in the sequence in response to an active refresh signal AREF. The refresh address generator 406 is also provided the command signal RHR from cycle generator 402. When the command signal RHR is active, the refresh address generator 406 may be controlled to stop updating the auto-refresh address Pre_RXADD even if the auto-refresh signal AREF is active in some embodiments. As described herein, since the active command signal RHR indicates that a targeted refresh operation is to be conducted instead of an auto-refresh operation, this allows the auto-refresh operation to be suspended while the targeted refresh is carried out, and resumed when the command signal RHR is not active. However, as will be described in more detail, in some embodiments, an active Empty signal provided by the targeted address queue 408 may override the command signal RHR to prevent suspension of the auto-refresh operation.

The targeted address queue 408 may receive targeted refresh address HitXADD1 from stack 404 and provide the targeted refresh address HitXADD2 based on the targeted refresh address HitXADD1. Targeted address queue 408 may store one or more targeted refresh addresses HitXADD1 received from the stack 404. As mentioned previously, count values for multiple victim row addresses may meet or exceed the threshold value between targeted refresh intervals. In some embodiments, the victim row addresses may be stored in the targeted address queue 408 for refreshing during sequential targeted refresh intervals. The targeted address queue 408 may be a "first-in-first-out" queue in some embodiments. In some embodiments, the targeted address queue 408 may include a plurality of registers. However, other storage structures may be used. In some embodiments, the targeted address queue 408 may have a pointer that points to a victim row address to be output as targeted refresh address HitXADD2. Responsive to an active command signal RHR, the pointer may be incremented to the next victim row address in the queue and the next victim row address may be output as HitXADD2. In some embodiments, the targeted address queue 408 may clear a register once the victim row address stored in the register is provided as HitXADD2. In some embodiments, the targeted address queue 408 may use a flag to indicate a victim row address has been provided as HitXADD2. Clearing the register and/or setting flags may allow the targeted address queue 408 to determine when a register is available for rewriting and/or the queue is empty. Other techniques for controlling the queue and determining the status of the queue may also be used. If the targeted address queue 408 determines the queue of victim row addresses is empty, the targeted address queue 408 may activate an Empty signal in some embodiments.

The multiplexer 410 accepts the auto-refresh address Pre_RXADD provided by the AREF address generator 406 and the targeted refresh address HitXADD2 provided by the targeted address queue 408 and outputs one of them as the refresh address RXADD. The multiplexer 410 may select between the two refresh addresses based on the command signal RHR and Empty signal. Control logic 412 is provided the command signals RHR and Empty and an output is provided to the multiplexer 410 to control selection of providing the Pre_RXADD or HitXADD2 addresses as the refresh address RXADD. The control logic 412 outputs a first logic level if command signal RHR is active and Empty is inactive. The multiplexer 410 outputs the targeted address HitXADD2 in response to the first logic level. If command signal RHR is inactive, the control logic 412 may output a second logic level regardless of the Empty signal. The multiplexer 410 outputs the auto-refresh address Pre_RXADD in response to the second logic level. If the command signal RHR is active, but the Empty signal is active (e.g., the targeted address queue 408 is empty), the control logic 412 may output the second logic level and the multiplexer 410 may output the auto-refresh address Pre_RXADD. As mentioned previously, the active Empty command may override the command signal RHR provided to the AREF address generator 406, so a current Pre_RXADD is provided. Thus, even during a targeted refresh interval, if no victim rows require refreshing, an auto-refresh operation may be performed in some embodiments. In some applications, this may reduce the steal rate.

In other embodiments, if the targeted address queue 408 is empty, no refresh operation may be performed. That is, a number of refresh operations dedicated to targeted refresh operations may remain constant. However, because not all victim rows are refreshed at the same rate, refreshing of victim rows during both targeted and auto-refresh operations are tracked, and/or accesses to victim row addresses are tracked, a memory may be designed with a lower steal rate.

Figure 5:
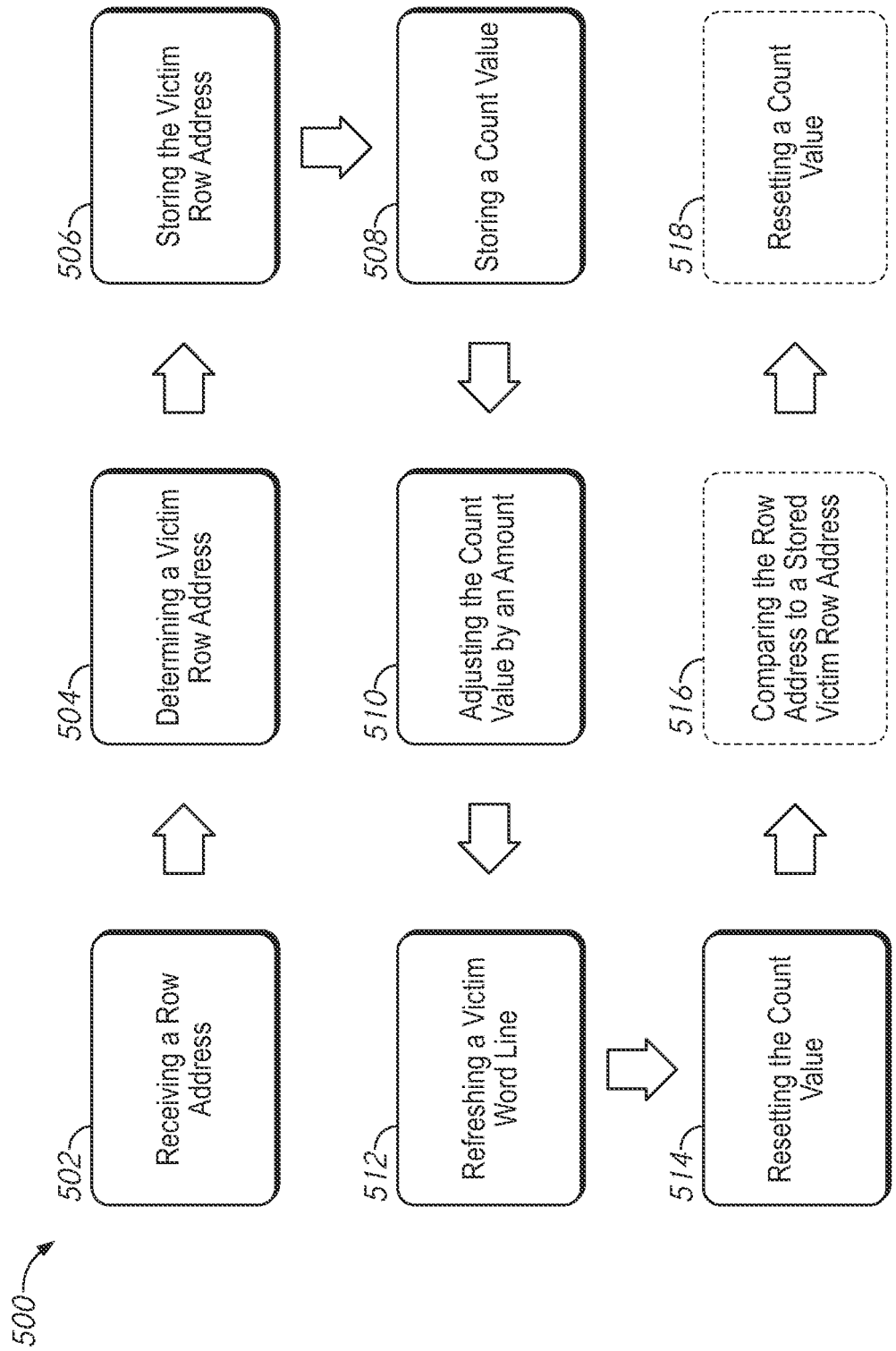
FIG. 5 is a flow chart of a method according to an embodiment of the disclosure.

FIG. 5 is a flowchart 500 of a method according to an embodiment of the disclosure. At block 502, a step of "receiving a row address" may be performed. The row address may be associated with a word line accessed by a memory operation. At block 504, "determining a victim row address" may be performed. The victim row address may be determined based, at least in part, on the row address. In some embodiments, the victim row address may be determined by a victim row decoder circuit, such as victim row decoder circuit 230 shown in FIG. 2.

At block 506, a step of "storing the victim row address" may be performed. In some embodiments, the victim row address may be stored in a register, such as register 302 shown in FIG. 3. The register may be in a stack, such as stack 232 in FIG. 2, stack 300 in FIG. 3, and/or stack 404 shown in FIG. 4. At block 508, a step of "storing a count value" may be performed. The count value may be associated with the victim row address in the register. The count value may also be stored in the register similar to the victim row address. At block 510, a step of "adjusting the count value by an amount" may be performed. Adjusting the count value may be performed each time the victim row address is determined. In some embodiments, the amount the count value is adjusted may be based, at least in part, on a proximity of the victim word line associated with the victim row address to an aggressor word line associated with the row address.

At block 512, "refreshing a victim word line" may be performed. The victim word line may be associated with the victim row address. The refreshing may be performed during a targeted refresh interval. The refresh operation may be performed by a refresh control circuit, such as refresh control circuit 116 in FIG. 1 and/or refresh control circuit 216 shown in FIG. 2. The victim word line may be refreshed if the count value reaches a threshold value. At block 514, "resetting the count value" may be performed. The count value may be reset after refreshing the victim word line.

In some embodiments, at block 516, a step of "comparing the row address to a stored victim row address" may be performed. If the row address matches the stored victim row address, at block 518, a step of "resetting a count value" may be performed. The count value may be associated with the stored victim row address. The dashed line shown for blocks 516 and 518 represents that in some embodiments of the disclosure, one or both of the steps are optional and may not be included.

Figure 6:
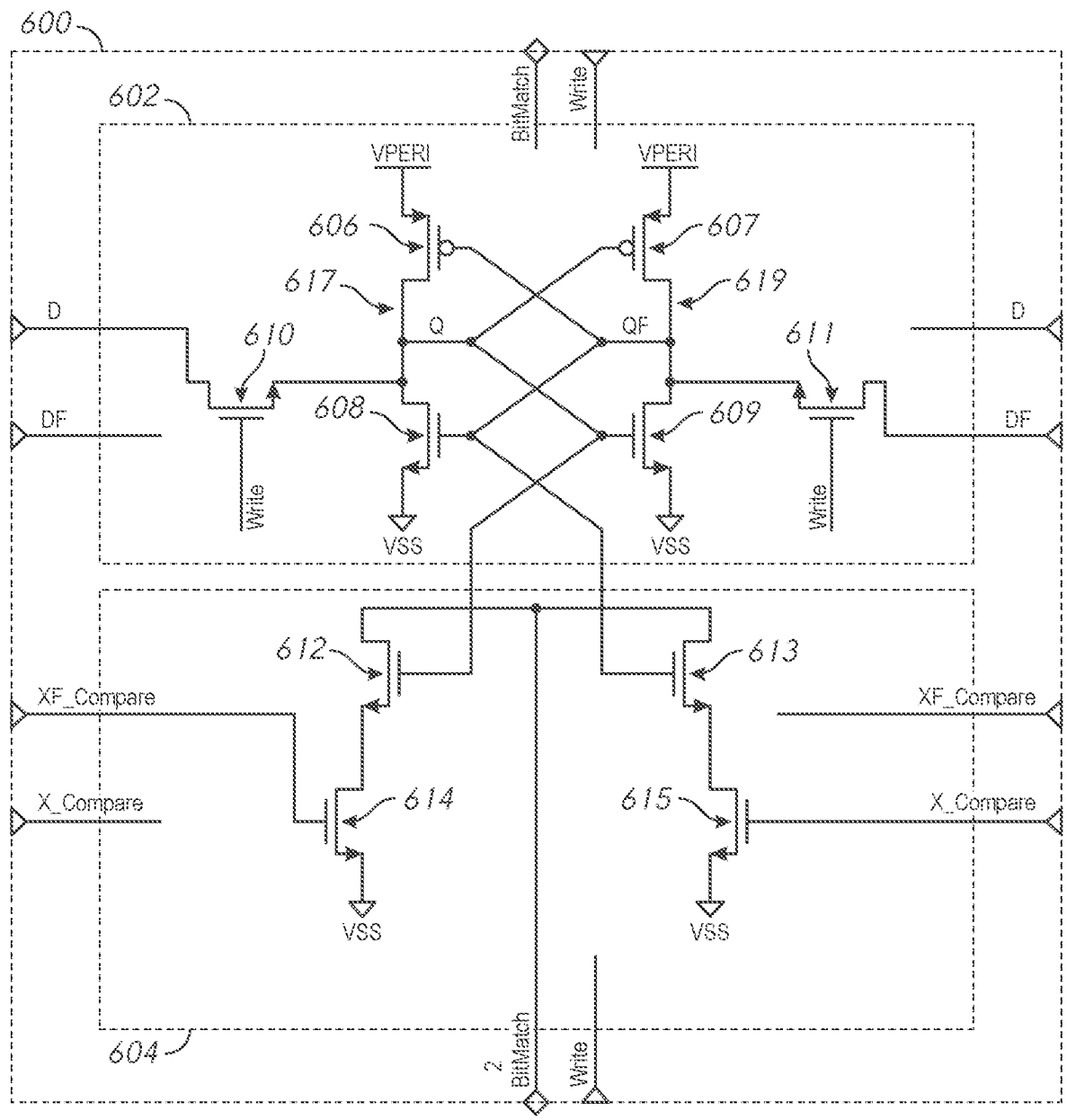
FIG. 6 is a diagram of a content addressable memory cell according to an embodiment of the disclosure.

FIG. 6 is a diagram of a content addressable memory (CAM) cell according to an embodiment of the present disclosure. In some embodiments, the CAM cell 600 may be included in a stack, such as stack 232 shown in FIG. 2, stack 300 shown in FIG. 3, and/or stack 404 shown in FIG. 4. In some embodiments, the CAM cell 600 may be included in a register, such as registers 302 shown in FIG. 3. A register may include multiple CAM cells 600. A register may include a CAM cell for every bit stored in the register. For example, a register may include a CAM cell for each bit of a victim row address and each bit of a count value. A stack may include multiple registers that include CAM cells.

The CAM cell 600 includes a latch portion 602 and a comparator portion 604. The CAM cell 600 may generally use voltages to represent the values of various bits. The CAM cell 600 may include conductive elements (e.g., nodes, conductive lines) which carry a voltage representing a logical value of that bit. For example, a high logical level may be represented by a first voltage (e.g., a system voltage such as VPERI), while a low logical level may be represented by a second voltage (e.g., a ground voltage, such as VSS).

The latch portion 602 includes a first transistor 606 which has a source coupled to a node which provides a voltage VPERI, which may represent a high logical level. The first transistor 606 has a drain coupled to a node 617 having a voltage which represents the value of the signal Q and a gate coupled to a node 619 having a voltage which represents a value of the complementary signal QF. The signal Q represents the logical level of a bit stored in the latch portion 602. The first transistor 606 may be a p-type transistor. The latch portion 602 also includes a second transistor 607 which has a source coupled to the node which provides VPERI, a gate coupled to the node 617 and a drain coupled to the node 619. The second transistor 607 may be a p-type transistor.

The latch portion 602 includes a third transistor 608 which has a drain coupled to the node 617, a gate coupled to the node 619, and a source coupled to a node providing a ground voltage VSS, which may represent a low logical level. The third transistor 608 may be an n-type transistor. The latch portion 602 includes a fourth transistor 609 which has a drain coupled to the node 619, a gate coupled to the node 617, and a source coupled to the node providing the ground voltage VSS. The fourth transistor 609 may be an n-type transistor. The transistors 606 and 608 may form an inverter circuit and the transistors 607 and 609 may form another inverter circuit, and the two inverter circuits are cross-coupled to one another.

In operation, the first, second, third, and fourth transistors 606-609 may work to store the value of the stored signals Q and QF. The transistors 606-609 may work together to couple the node 617 carrying Q and the node 619 carrying QF to a node providing the system voltage (e.g., VPERI or VSS) associated with the value of the signals Q and QF. For example, if the stored signal Q is at a high logical level, then the inverse signal QF is at a low logical level. The first transistor 606 may be active, and VPERI may be coupled to the node 617. The second transistor 607 and the third transistor 608 may be inactive. The fourth transistor 609 may be active and may couple VSS to the node 619. This may keep the node 617 at a voltage of VPERI, which represents a high logical level, and the node 619 at a voltage of VSS, which represents a low logical level. In another example, if the stored signal Q is at a low logical level, then the inverse signal QF may be at a high logical level. The first transistor 606 and the fourth transistor 609 may both be inactive. The second transistor 607 may be active and may couple VPERI to the node 619. The third transistor 608 may also be active and may couple VSS to the node 617. In this manner, the stored signal Q and QF may be coupled to a respective system voltage corresponding to their current logical levels, which may maintain the current logical value of the stored bit.

The latch portion 602 also includes a fifth transistor 610 and a sixth transistor 611. The transistors 610 and 611 may act as switches which may couple a signal line which carries input data D and a signal line carrying inverse input data DF to the nodes 617 and 619 carrying Q and QF respectively when a write signal Write is active. The fifth transistor 610 has a gate coupled to a line carrying the Write signal, a drain coupled to the signal D, and a source coupled to the node 619. The sixth transistor 611 has a gate coupled to the Write signal, a drain coupled to the signal DF, and a source coupled to the node 619. Accordingly, when the Write signal is at a high level (e.g., at a voltage such as VPERI), the transistors 610 and 611 may be active, and the voltages of the signals D and DF may be coupled to the nodes 617 and 619 carrying Q and QF respectively.

In some embodiments, the first through sixth transistors 606-611 may generally all be the same size as each other.

The CAM cell 600 also includes a comparator portion 604. The comparator portion 604 may compare the signals Q and QF to the signals X_Compare and XF_Compare. The signal X_Compare may represent a logical level of an external bit provided to the comparator portion 604. If there is not a match between the signals Q and X_Compare (and therefore between QF and XF_Compare), then the comparator portion 606 may change a state of from the BitMatch signal from a first logical level (e.g., a high logical level) to a second logical level (e.g., a low logical level). For example, if the stored and external bits do not match, the comparator portion 604 may couple the ground voltage VSS to a signal line carrying the signal BitMatch. In some embodiments, if there is a match between the stored and external bits, then the comparator portion 606 may do nothing. In some embodiments, the signal BitMatch may be precharged to a voltage associated with a high logical level (e.g., VPERI) before a comparison operation.

The comparator portion includes a seventh transistor 612, an eighth transistors 613, a ninth transistor 614, and a tenth transistor 615. The seventh transistor 612 includes a drain coupled to the signal BitMatch, a gate coupled to the node 617 (e.g., the signal Q), and a source coupled to a drain of the ninth transistor 614. The ninth transistor 614 also has a gate coupled to the signal XF_Compare and a source coupled to a signal line providing the ground voltage VSS.

The eighth transistor 613 has a drain coupled to the signal BitMatch, a gate coupled to the node 619 (e.g., the signal QF), and a source coupled to a drain of the tenth transistor 615. The tenth transistor has a gate coupled to the signal X_Compare and a source coupled to the ground voltage VSS.

Since the signal Q is complementary to the signal QF, the comparator portion 602 may operate by comparing the external signal X_Compare to the signal QF to see if they match, and the inverse external signal XF_Compare to the stored signal Q to see if they match. If they do match, it may indicate that the signal X_Compare does not match the signal Q and that the signal XF_Compare does not match the signal QF, and thus that the external bits do not match the associated stored bits.

The comparator portion 604 may use relatively few components, since it changes the signal BitMatch from a known state (e.g., a precharged high logical level) to a low logical level. Thus, it may not be necessary to include additional components (e.g., additional transistors) to change the logical level of the signal BitMatch from low to high, or from an unknown level to either low or high. The comparator portion 604 may take advantage of this to provide dynamic logic. For example, the comparator portion 604 has two portions (e.g., transistors 612/614 and transistors 614/615) either of which may couple the signal BitLine to the voltage VSS if there is not a match between the stored and external bit. Since only one of the portions is active at a time, only the state of the signal Q or QF needs to be checked by the active portion. Either of the portions is equally capable of changing the signal BitMatch to a low logical level.

In an example operation, if the stored signal Q is at a high logical level (and thus the signal QF is low) and the external signal X_Compare is also high (and the signal XF_Compare is low), then the external signals may match the stored signals, and the transistors 612 and 615 may be active while the transistors 614 and 613 are inactive. This may prevent the ground voltage VSS from being coupled to the signal BitMatch. If the signal X_Compare is low (e.g., if there is not a match), then the external signals may not match the stored signals, and the transistors 612 and 614 may be active wile transistors 613 and 615 are inactive. The transistors 612 and 614 being active at the same time may couple the ground voltage VSS to the signal BitMatch.

In another example operation if the stored signal Q is low (and thus the signal QF is high) then the transistor 612 may be inactive while the transistor 613 is active. If the external signal X_Compare is low (and XF_Compare is high) then the external signal may match the stored bits, and the transistor 614 is active while transistor 615 is inactive. If the signal X_Compare is high (and the signal XF_Compare is low) then the external signal may not match the stored signal and the transistor 614 may be inactive while the transistor 615 is active. Accordingly, the signal BitMatch may be coupled to ground voltage VSS through active transistors 613 and 615.

In some embodiments, the transistors 612-615 of the comparator portion 604 may generally all have the same size to each other. In some embodiments, the transistors 612-615 of the comparator portion 604 may be a different size than the transistors 606-611 of the latch portions 602.

In some applications, using the CAM cell to implement registers and/or stacks may allow for victim row addresses calculated by a victim row decoder circuit (e.g., victim row decoder circuit 230), to be compared to the victim row addresses already stored in the register and/or stack within a time period that does not impede the operation of the memory. If any of the victim row addresses are not in the register and/or stack, they may be timely written to the stack. If any of the victim row addresses are already stored in the register and/or stack, count values associated with the victim row address may be timely adjusted. In some applications, using the CAM cell to implement registers and/or stacks may allow for row addresses and/or refresh addresses to be compared to the victim row addresses already stored in the register and/or stack within a time period that does not impede the operation of the memory. If any of the row or refresh addresses are already stored in the register and/or stack, count values associated with the victim row address may be timely reset. Thus, in some applications, the CAM cell may allow for tracking of word line accesses and storage of information related to victim word lines. However, in other applications, other memory cell structures may be used.

The apparatuses, systems, and methods described herein may provide for tracking of victim rows, such as by storing victim row addresses. Storing data regarding victim rows may allow for a reduction in steal rates and/or reduction in power consumption in some applications.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a refresh address generator comprising:
an auto refresh address generator configured to generate an auto refresh address;
a targeted address queue configured to store a plurality of victim row addresses, wherein the targeted address queue provides an active empty signal when the targeted address queue is empty,
wherein the refresh address generator is configured to provide the auto refresh address responsive, at least in part, to the active empty signal; and
a stack configured to store a second plurality of victim row addresses and provide at least one of the second plurality of victim row addresses to the targeted address queue to be stored as at least one of the plurality of victim row addresses.

2. The apparatus of claim 1, wherein the refresh address generator further comprises a cycle generator configured to provide a refresh control signal, wherein the targeted address queue is configured to provide at least one of the plurality of victim row addresses when the refresh control signal has a first logic state and the empty signal is inactive.

3. The apparatus of claim 2, wherein the auto refresh address generator is configured to pause generation of the auto refresh address when the refresh control signal has the first logic state.

4. The apparatus of claim 1, further comprising a multiplexer configured to receive a victim row address of the plurality of victim row addresses and the auto refresh address and provide at least one of the victim row address or the auto refresh address as a refresh address.

5. The apparatus of claim 4, further comprising a control logic circuit configured to provide a control signal to the multiplexer, wherein whether the victim row address or the auto refresh address is provided by the multiplexer is based, at least in part, on a logic state of the control signal.

6. The apparatus of claim 1, wherein the refresh address generator is configured to provide the auto refresh address during an auto refresh operation and provide the auto refresh address during a targeted refresh operation when the empty signal is active.

7. The apparatus of claim 1, a register including a first field configured to store the a victim row address and a second field configured to store a count value, wherein the count value is adjusted each time the victim row address is received and provide the victim row address to the targeted address queue when the count value reaches a threshold value.

8. A method comprising:
storing a count value associated with a victim row address;
adjusting the count value by an amount;
providing the victim row address to the targeted address queue for storage when the count value reaches a threshold value;
receiving a signal indicating a targeted refresh operation at a refresh address generator;
determining whether a targeted address queue is empty; and
when the targeted address queue is empty, providing an auto refresh address as a refresh address responsive, at least in part, to the signal indicating the targeted refresh operation.

9. The method of claim 8, wherein the determining comprises receiving an empty signal having a first or a second logic state, wherein the empty signal has the first logic state when the targeted address queue is empty and the second logic state when the targeted address queue includes at least one victim row address.

10. The method of claim 8, further comprising when the targeted address queue includes at least one victim row address, providing the victim row address as the refresh address responsive, at least in part, to the signal indicating the targeted refresh operation.

11. The method of claim 8, further comprising:
receiving a signal indicating an auto refresh operation at the refresh address generator; and
providing the auto refresh address as the refresh address responsive to the signal indicating the auto refresh operation.

12. An apparatus comprising:
a register including a first field configured to store a victim row address and a second field configured to store a count value, wherein the count value is adjusted each time the victim row address is received and provide the victim row address when the count value reaches a threshold value, wherein a magnitude the count value is adjusted is proportional to a proximity of the victim word line to a word line associated with the row address; and
a refresh address generator circuit configured to receive the victim row address from the register and provide the victim row address for a refresh operation on a victim word line associated with the victim row address during a targeted refresh interval and provide an auto-refresh address for the refresh operation on a word line corresponding to the auto-refresh address when the register does not provide the victim row address.

13. The apparatus of claim 12, further comprising a victim row decoder circuit configured to determine the victim row address based, at least in part, on a row address and provide the victim row address to the register.

14. The apparatus of claim 12, wherein the count value is reset when the victim word line associated with the victim row address is accessed or refreshed.

15. A method comprising:
storing a count value associated with a victim row address stored in a register;
adjusting the count value by an amount each time the victim row address is associated with a row address associated with a memory access operation, wherein a magnitude the count value is adjusted is proportional to a proximity of the victim word line to a word line associated with the row address; and
refreshing a word line corresponding to an auto-refresh address during a targeted refresh operation when the count value has not reached a threshold value.

16. The method of claim 15, further comprising:
refreshing a victim word line associated with the victim row address during the targeted refresh interval when the count value reaches the threshold value; and
resetting the count value after refreshing the victim word line.

17. The method of claim 15, further comprising:
comparing the row address to a stored victim row address; and
if the row address matches the stored victim row address, resetting a count value associated with the stored victim row address.

* * * * *